(12) United States Patent
Shirakawa et al.

(10) Patent No.: US 12,073,890 B2
(45) Date of Patent: *Aug. 27, 2024

(54) MEMORY SYSTEM

(71) Applicant: KIOXIA CORPORATION, Tokyo (JP)

(72) Inventors: Masanobu Shirakawa, Chigasaki (JP);
Tsukasa Tokutomi, Kamakura (JP);
Marie Takada, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/174,916

(22) Filed: Feb. 27, 2023

(65) Prior Publication Data

US 2023/0223090 A1    Jul. 13, 2023

Related U.S. Application Data

(63) Continuation of application No. 17/131,026, filed on Dec. 22, 2020, now Pat. No. 11,626,167, which is a continuation of application No. 16/291,308, filed on Mar. 4, 2019, now Pat. No. 10,910,066.

(30) Foreign Application Priority Data

Sep. 18, 2018  (JP) .................................. 2018-174146

(51) Int. Cl.
| | |
|---|---|
| G11C 16/26 | (2006.01) |
| G11C 11/56 | (2006.01) |
| G11C 16/04 | (2006.01) |
| H10B 43/27 | (2023.01) |
| H10B 43/35 | (2023.01) |

(52) U.S. Cl.
CPC .......... *G11C 16/26* (2013.01); *G11C 11/5671* (2013.01); *G11C 16/0483* (2013.01); *H10B 43/27* (2023.02); *H10B 43/35* (2023.02)

(58) Field of Classification Search
CPC . G11C 16/26; G11C 11/5671; G11C 16/0483; G11C 11/5642; G11C 29/42; G11C 29/52; G11C 2029/0409; G11C 2207/2254; H10B 43/27; H10B 43/35
USPC ........................................................ 711/103
See application file for complete search history.

(56) References Cited

U.S. PATENT DOCUMENTS

| | | |
|---|---|---|
| 9,147,483 B2 | 9/2015 | Yoon |
| 9,437,315 B2 | 9/2016 | Lee |
| 9,672,942 B2 | 6/2017 | Yoon et al. |

(Continued)

*Primary Examiner* — James C Kerveros
(74) *Attorney, Agent, or Firm* — Oblon, McClelland, Maier & Neustadt, L.L.P.

(57) ABSTRACT

According to one embodiment, a memory system includes a semiconductor memory device and a controller. The device includes a plurality of memory cells capable of storing at least first to third data and a word line coupled to the plurality of memory cells. The first data is determined by a first read operation including a first read level. The second data is determined by a second read operation including a second read level. The third data is determined by a third read operation including a third read level. The controller controls the semiconductor memory device to perform a forth read operation including the first and second read levels in a search operation for first to third read voltages corresponding to the first to third read levels, respectively.

15 Claims, 20 Drawing Sheets

(56) References Cited

U.S. PATENT DOCUMENTS

| | | |
|---|---|---|
| 9,728,263 B2 | 8/2017 | Sharon |
| 9,761,308 B1 | 9/2017 | Cometti |
| 9,852,065 B1 | 12/2017 | Rajwade et al. |
| 2007/0171709 A1* | 7/2007 | Kang ................ G11C 16/0483 365/185.18 |
| 2008/0239812 A1 | 10/2008 | Abiko |
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2012/0033502 A1 | 2/2012 | Eun |
| 2014/0169102 A1 | 6/2014 | Sun |
| 2015/0179272 A1* | 6/2015 | Kim ................ G11C 16/26 365/185.03 |
| 2017/0117055 A1* | 4/2017 | Kim ................ G11C 16/10 |
| 2017/0125089 A1 | 5/2017 | Sankaranarayanan et al. |
| 2018/0034485 A1* | 2/2018 | Marelli ................ G11C 29/028 |
| 2019/0080752 A1* | 3/2019 | Hwang ................ G11C 11/5671 |
| 2020/0192759 A1* | 6/2020 | Hwang ................ G11C 29/52 |

\* cited by examiner

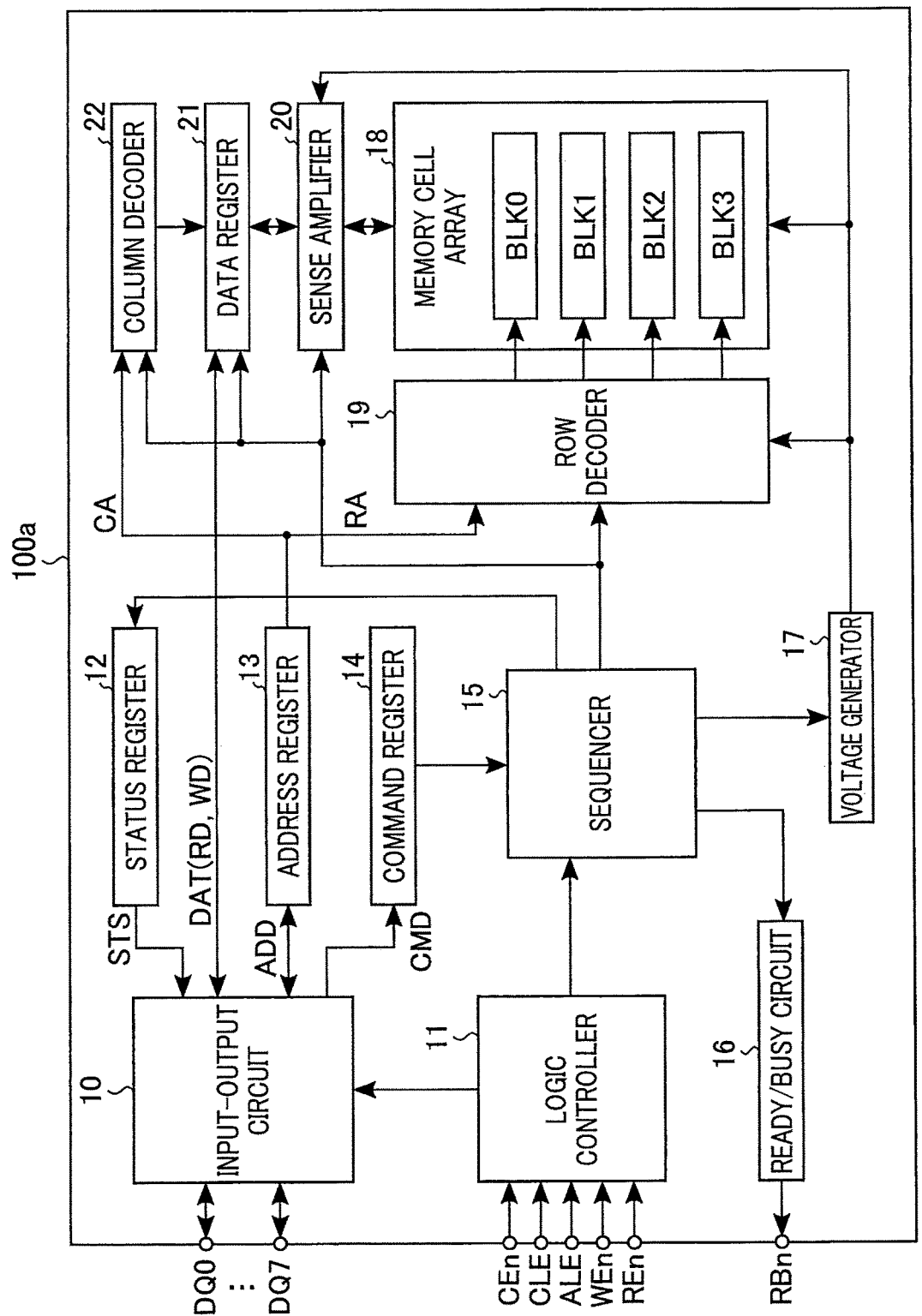
F I G. 2

| SECTION | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| R3  | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 |
| R8  | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |
| R13 | 1 | 1 | 1 | 1 | 1 | 1 | 1 | 1 | 1 | 1 | 1 | 1 | 1 | 1 | 1 | 1 | 1 | 1 | 0 | 0 | 0 | 0 | 0 | 0 |
| SF1 | 1 | 0 | 0 | 0 | 0 | 0 | 0 | 1 | 1 | 1 | 1 | 1 | 1 | 0 | 0 | 0 | 0 | 0 | 0 | 1 | 1 | 1 | 1 | 1 |
| SF2 | 1 | 1 | 0 | 0 | 0 | 0 | 0 | 0 | 0 | 1 | 1 | 1 | 1 | 1 | 0 | 0 | 0 | 0 | 0 | 0 | 1 | 1 | 1 | 1 |
| SF3 | 1 | 1 | 1 | 0 | 0 | 0 | 0 | 0 | 0 | 0 | 0 | 1 | 1 | 1 | 1 | 0 | 0 | 0 | 0 | 0 | 0 | 1 | 1 | 1 |
| SF4 | 1 | 1 | 1 | 1 | 0 | 0 | 0 | 0 | 0 | 0 | 0 | 0 | 1 | 1 | 1 | 1 | 0 | 0 | 0 | 0 | 0 | 0 | 1 | 1 |
| SF5 | 1 | 1 | 1 | 1 | 1 | 0 | 0 | 0 | 0 | 0 | 0 | 0 | 1 | 1 | 1 | 1 | 1 | 0 | 0 | 0 | 0 | 0 | 0 | 1 |

GROUP A (R3&R8&R13=1) : sections 1–6
GROUP B (/R3&R8&R13=1) : sections 7–12
GROUP C (/R3&/R8&R13=1) : sections 13–18
GROUP D (/R3&/R8&/R13=1) : sections 19–24

F I G. 10

MEMORY SYSTEM

CROSS-REFERENCE TO RELATED APPLICATIONS

This application is a continuation of and claims benefit under 35 U.S.C. § 120 to U.S. application Ser. No. 17/131,026 filed Dec. 22, 2020, which is a continuation of and claims benefit under 35 U.S.C. § 120 to U.S. application Ser. No. 16/291,308, filed Mar. 4, 2019 (now U.S. Pat. No. 10,910,066), which is based upon and claims the benefit of priority under 35 U.S.C. § 119 from Japanese Patent Application No. 2018-174146, filed Sep. 18, 2018, the entire contents of each of which are incorporated herein by reference.

FIELD

Embodiments described herein relate generally to a memory system.

BACKGROUND

As a semiconductor memory device, a NAND flash memory is known.

BRIEF DESCRIPTION OF THE DRAWINGS

FIG. 2 is a block diagram of a semiconductor memory device included in the memory system of the first embodiment;

FIG. 10 is a table showing level separation of data read by the shift read operation in the memory system of the first embodiment;

DETAILED DESCRIPTION

In general, according to one embodiment, a memory system includes a semiconductor memory device and a controller configured to control the semiconductor memory device. The semiconductor memory device includes, a plurality of memory cells capable of storing at least first to third data and a word line coupled to the plurality of memory cells. The first data is determined by a first read operation including a first read level. The second data is determined by a second read operation including a second read level. The third data is determined by a third read operation including a third read level. The controller is configured to control the semiconductor memory device to perform a forth read operation including the first and second read levels in a search operation for first to third read voltages corresponding to the first to third read levels, respectively.

1. First Embodiment

A memory system according to a first embodiment will be described. As an example of a semiconductor memory device, a three-dimensional stacked NAND flash memory with memory cell transistors stacked above a semiconductor substrate will be described below.

1.1. Configuration 1.1.1. Configuration of Memory System

First, an overall configuration of a memory system 1 will be described with reference to FIG. 1.

Figure 1:
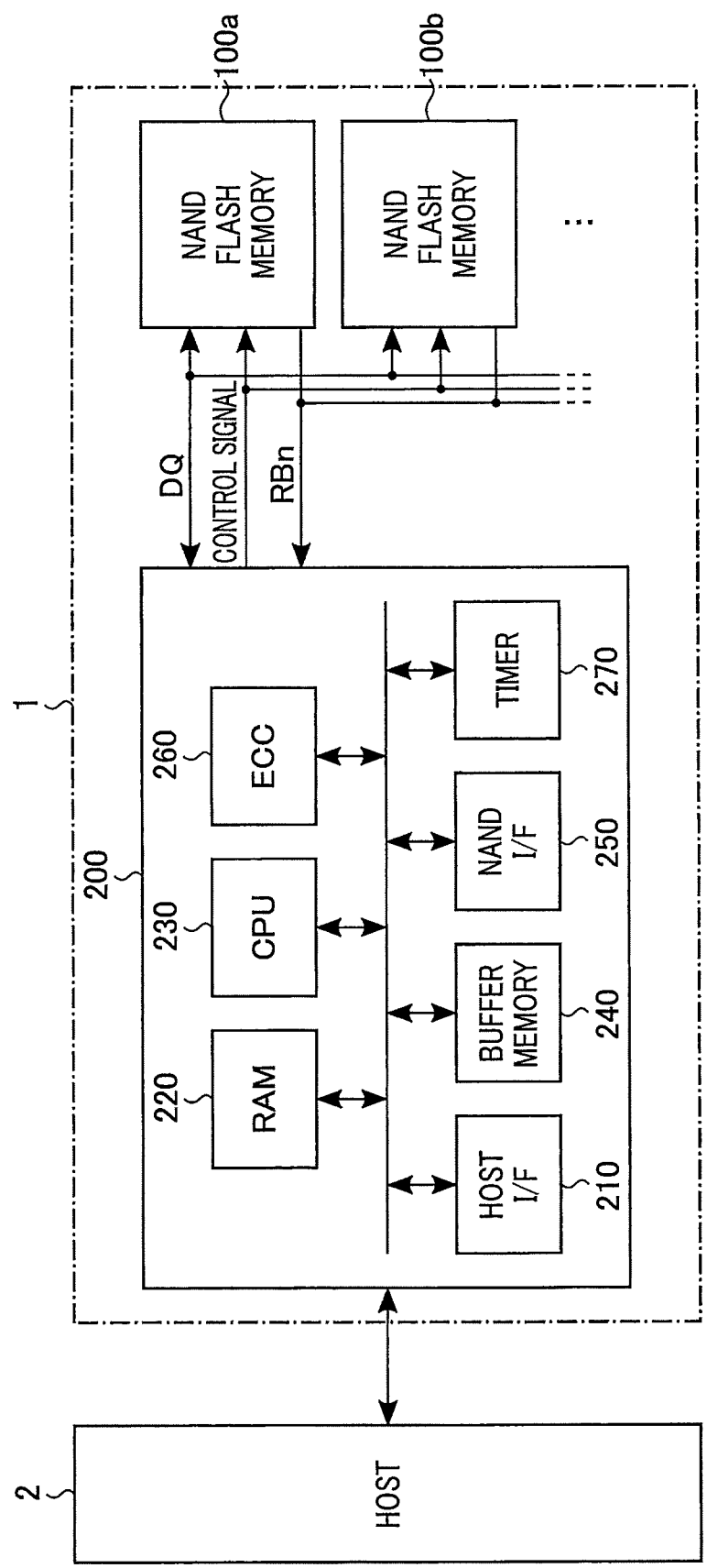
FIG. 1 is a block diagram of a memory system according to a first embodiment.

As shown in FIG. 1, the memory system 1 includes a plurality of NAND flash memories 100 (100a, 100b, . . . ) and a controller 200, and is coupled to an external host device 2. In the case of not specifying NAND flash memories 100a, 100b, . . . , the NAND flash memories will be hereinafter indicated as a NAND flash memory 100 or NAND flash memories 100. The controller 200 and the NAND flash memory 100 may be combined to form a single semiconductor memory device, examples of which include a memory card such as an SD™ card, an SSD (solid state drive), etc.

The NAND flash memory 100 is a nonvolatile memory capable of storing data in a nonvolatile manner. The plurality of NAND flash memories 100 can operate independently of each other. The number of NAND flash memories 100 included in the memory system 1 is discretionary as long as at least one NAND flash memory 100 is included.

The controller 200 commands the NAND flash memory 100 to execute data read, write, erase operations, etc., in response to a demand (command) from the host device 2. The controller 200 can perform an operation of searching for a read voltage in the NAND flash memory 100 (hereinafter referred to as a "patrol operation"). The patrol operation is performed on the NAND flash memory 100 in a predetermined period (hereinafter referred to as a "patrol period") without a command from the host device 2, for example. The patrol operation is performed, for example, during a free time of the memory system 1 (e.g., a standby state of not receiving a command from the host device 2). The patrol operation will be detailed later. The controller 200 manages a memory space of the NAND flash memory 100. Each function of the controller 200 may be implemented by a dedicated circuit, or may be implemented by a processor executing firmware. In the present embodiment, a case where a dedicated circuit is provided in the controller 200 will be described.

The controller 200 includes a host interface circuit 210, an internal memory (RAM) 220, a processor (CPU: central processing unit) 230, a buffer memory 240, a NAND interface circuit 250, an ECC circuit 260, and a timer 270.

The host interface circuit 210 is coupled with the host device 2 via a host bus to communicate with the host device 2. For example, the host interface circuit 210 transfers, to the CPU 230 and the buffer memory 240, a command and data received from the host device 2. The host interface circuit 210 transfers data within the buffer memory 240 to the host device 2, in response to a command from the CPU 230.

The RAM 220 is, for example, a semiconductor memory such as DRAM, and holds firmware for managing the NAND flash memory 100, various management tables, etc. The RAM 220 is used as a working area of the CPU 230.

The CPU 230 controls the entire operation of the controller 200. For example, the CPU 230 issues a write command to the NAND interface circuit 250 in response to a write command received from the host device 2. The CPU 230 operates in a similar manner in response to a read command and an erase command. The CPU 230 controls the patrol operation in the patrol period based on the counting of the timer 270. The CPU 230 executes various types of processing, such as wear leveling, for managing the memory space of the NAND flash memory 100.

The buffer memory 240 temporarily holds read data received by the controller 200 from the NAND flash memory 100, write data received by the controller 200 from the host device 2, and the like.

The ECC circuit 260 performs data error checking and correcting (ECC) processing. Specifically, the ECC circuit 260 generates parity based on write data during a data write operation. During a data read operation, the ECC circuit 260 generates a syndrome based on the parity to detect an error, thereby correcting the detected error.

The NAND interface circuit 250 is coupled with the NAND flash memory 100 via a NAND bus to communicate with the NAND flash memory 100. For example, based on a command received from the CPU 230, the NAND interface circuit 250 transmits various control signals to the NAND flash memory 100, receives a ready/busy signal RBn from the NAND flash memory 100, and transmits/receives a signal DQ to/from the NAND flash memory 100.

The ready/busy signal RBn notifies whether or not the NAND flash memory 100 can receive commands from the controller 200. For example, the ready/busy signal RBn is set to a high ("H") level in a ready state in which the NAND flash memory 100 can receive commands from the controller 200. The ready/busy signal RBn is set to a low ("L") level in a busy state in which the NAND flash memory 100 cannot receive such commands.

The signal DQ is, for example, an 8-bit signal, and includes a command, address, data, and the like. More specifically, the signal DQ transferred to the NAND flash memory 100 during a write operation, for example, includes a write command issued by the CPU 230, address, and write data in the buffer memory 240. Also, the signal DQ transferred to the NAND flash memory 100 during a read operation includes a read command issued by the CPU 230 and address, and the signal DQ transferred to the controller 200 includes read data.

The timer 270 measures the time related to various operations of the memory system 1. For example, the timer 270 measures the patrol period for each NAND flash memory 100.

1.1.2. Configuration of NAND Flash Memory

Next, a configuration of the NAND flash memory 100 will be described with reference to FIG. 2. The example of FIG. 2 shows NAND flash memory 100a, but the same applies to other NAND flash memories 100. Also, part of the coupling between blocks is indicated by directional lines, but coupling between blocks is not limited thereto.

As shown in FIG. 2, the NAND flash memory 100 includes an input-output circuit 10, a logic controller 11, a status register 12, an address register 13, a command register 14, a sequencer 15, a ready/busy circuit 16, a voltage generator 17, a memory cell array 18, a row decoder 19, a sense amplifier 20, a data register 21, and a column decoder 22.

The input-output circuit 10 controls input and output of signals DQ[7:0] to and from the controller 200. More specifically, the input-output circuit 10 includes an input circuit and an output circuit. The input circuit transmits data DAT (write data WD) received from the controller 200 to the data register 21, transmits an address ADD received from the controller 200 to the address register 13, and transmits a command CMD received from the controller 200 to the command register 14. The output circuit transmits, to the controller 200, status information STS received from the status register 12, data DAT (read data RD) received from the data register 21, and address ADD received from the address register 13. The input-output circuit 10 and the data register 21 are coupled to each other via a data bus.

The logic controller 11 receives control signals from the controller 200. The control signals include, for example, a chip enable signal CEn, a command latch enable signal CLE, an address latch enable signal ALE, a write enable signal WEn, and a read enable signal REn. The logic controller 11 controls the input-output circuit 10 and the sequencer 15 according to a received signal.

The chip enable signal CEn is a signal to enable the NAND flash memory 100, and is asserted, for example, at an "L" level. The command latch enable signal CLE is a signal indicating that the signal DQ is a command, and is asserted, for example, at an "H" level. The address latch enable signal ALE is a signal indicating that the signal DQ is an address, and is asserted, for example, at an "H" level. The write enable signal WEn is a signal to import a received signal into the NAND flash memory 100, and is asserted, for example, at an "L" level every time a command, an address, data, and the like are received from the controller 200. Accordingly, every time the write enable signal WEn is toggled, the signal DQ is imported into the NAND flash memory 100. The read enable signal REn is a signal for the controller 200 to read data from the NAND flash memory 100. The read enable signal REn is asserted, for example, at an "L" level.

The status register 12 temporarily holds status information STS received from the sequencer 15, for example, in data write, read, and erase operations, and notifies the controller 200 whether or not the operations have ended properly.

The address register 13 temporarily holds an address ADD received from the controller 200 via the input-output circuit 10. The address register 13, for example, transfers a row address RA (including a block address and a page address) to the row decoder 19, and transfers a column address CA to the column decoder 22.

The command register 14 temporarily stores a command CMD received from the controller 200 via the input-output circuit 10, and transfers it to the sequencer 15.

The sequencer 15 controls the entire operation of the NAND flash memory 100. More specifically, the sequencer 15 controls the status register 12, the ready/busy circuit 16, the voltage generator 17, the row decoder 19, the sense amplifier 20, the data register 21, and the column decoder 22, etc., based on the command CMD held by the command register 14, thereby performing write, read, and erase operations, etc.

The ready/busy circuit 16 transmits a ready/busy signal RBn to the controller 200 based on the control of the sequencer 15.

The voltage generator 17 generates voltages necessary for write, read, and erase operations based on the control of the sequencer 15, and supplies the generated voltages to the memory cell array 18, the row decoder 19, the sense amplifier 20, etc.

The memory cell array 18 includes, for example, four blocks BLK0 to BLK3 including nonvolatile memory cell transistors (hereinafter also referred to as memory cells) associated with rows and columns. The number of blocks BLK in the memory cell array 18 is discretionary. A configuration of the memory cell array 18 will be detailed later.

The memory cell array 18 includes a user region and a management region as memory space regions. For example, each of the plurality of blocks BLK is allocated to either the user region or the management region. The user region is used for performing an operation of writing and an operation of reading user data received from the host device 2. The management region is, for example, a region where a control program, or management data, such as various configuration parameters, is stored. For example, parameter information of a read voltage is stored in the management region.

The row decoder 19 is coupled to interconnects (e.g., word lines and select gate lines) arranged in a row direction in the respective blocks BLK. The row decoder 19 applies voltages necessary for write, read, and erase operations to the interconnects of a selected block BLK.

The sense amplifier 20 senses data read from the memory cell array 18 during a read operation. The sense amplifier 20 transmits read data RD to the data register 21. The sense amplifier 20 transmits write data WD to the memory cell array 18 during a write operation.

The data register 21 includes a plurality of latch circuits. The latch circuits temporarily hold write data WD and read data RD. In a write operation, for example, the data register 21 temporarily holds write data WD received from the input-output circuit 10, and transmits the data to the sense amplifier 20. In a read operation, for example, the data register 21 temporarily holds read data RD received from the sense amplifier 20, and transmits the data to the input-output circuit 10.

The column decoder 22 decodes a column address CA in write, read, and erase operations, for example, and selects a latch circuit in the data register 21 based on a result of the decoding.

1.1.3. Circuit Configuration of Memory Cell Array

Figure 3:
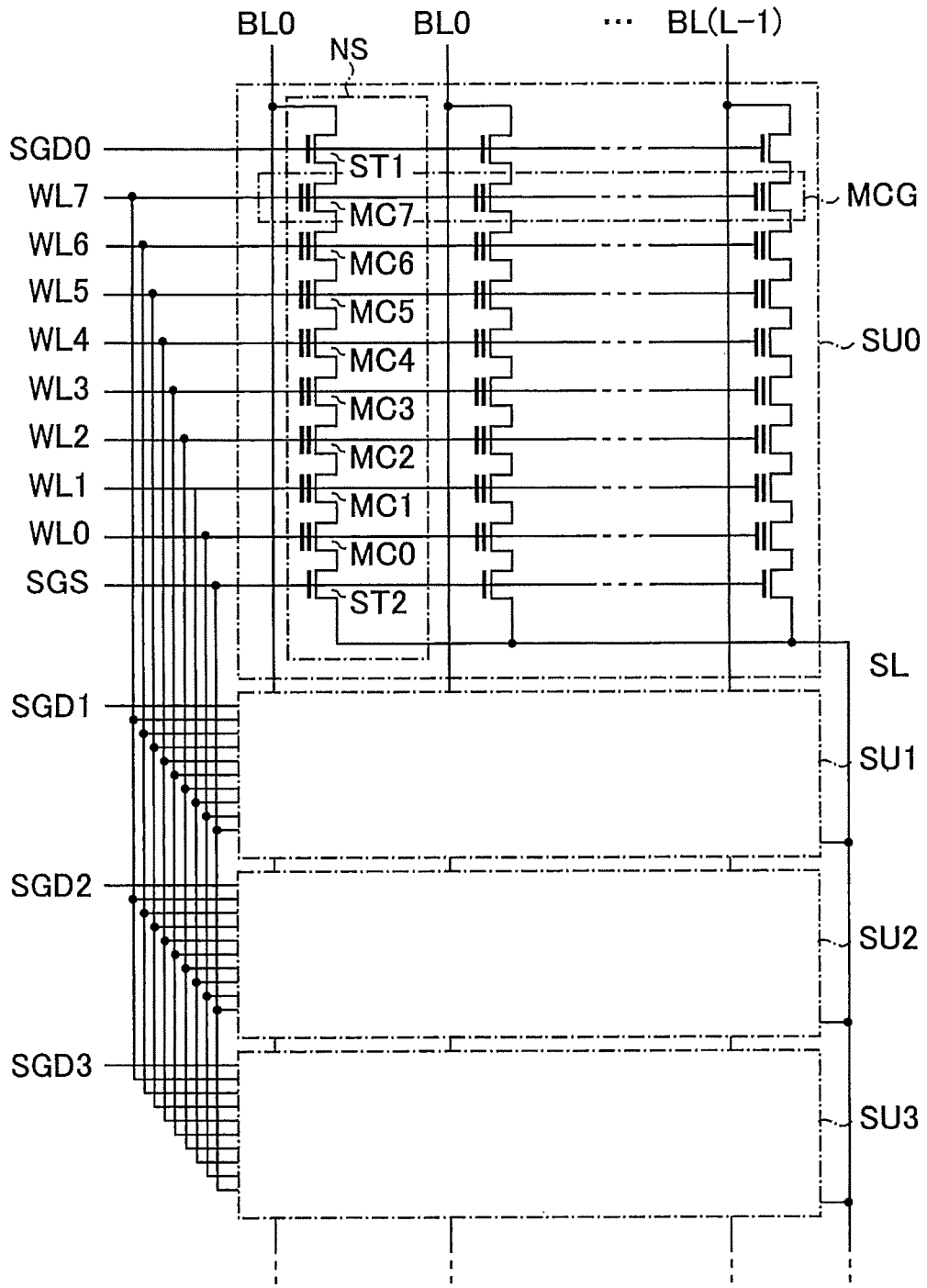
FIG. 3 is a circuit diagram of a memory cell array of the semiconductor memory device included in the memory system of the first embodiment.

Next, a circuit configuration of the memory cell array 18 will be described with reference to FIG. 3. FIG. 3 shows a circuit diagram of the memory cell array 18 in a block BLK.

The block BLK includes, for example, four string units SU0 to SU3, as shown in FIG. 3. The number of string units SU in the block BLK is discretionary. Each string unit SU includes a plurality of NAND strings NS. In the case of not specifying string units SU0 to SU3, the string units will be hereinafter indicated as a string unit SU or string units SU.

Each of the NAND strings NS includes, for example, eight memory cell transistors MC0 to MC7, and select transistors ST1 and ST2. In the case of not specifying memory cell transistors MC0 to MC7, the memory cell transistors will be hereinafter indicated as a memory cell transistor MC or memory cell transistors MC.

Each of the memory cell transistors MC is provided with a control gate and a charge storage layer, and holds data in a nonvolatile manner. The memory cell transistors MC may be of a MONOS type that uses an insulation layer for the charge storage layer, or may be of an FG type that uses a conductive layer for the charge storage layer. In the present embodiment, the MONOS type memory cell transistor will be described as an example. The number of memory cell transistors MC included in each NAND string NS is not limited, and may be 16, 32, 48, 64, 96, 128, etc. Also, the number of select transistors ST1 and ST2 included in each NAND string NS is discretionary as long as at least one select transistor ST1 and at least one select transistor ST2 are provided.

Memory cell transistors MC0 through MC7 are coupled in series between the source of select transistor ST1 and the drain of select transistor ST2. More specifically, the current paths of memory cell transistors MC0 through MC7 are coupled in series. The drain of memory cell transistor MC7 is coupled to the source of select transistor ST1, and the source of memory cell transistor MC0 is coupled to the drain of select transistor ST2.

The gates of select transistors ST1 in string units SU0 through SU3 are coupled to select gate lines SGD0 through SGD3, respectively. The gates of select transistors ST2 in string units SU0 through SU3 are coupled in common to select gate line SGS. In the case of not specifying select gate lines SGD0 to SGD3, the select gate lines will be hereinafter indicated as a select gate line SGD or select gate lines SGD. The gates of select transistors ST2 in string units SU0 through SU3 may be coupled to select gate lines SGS0 through SGS3, respectively.

The control gates of memory cell transistors MC0 through MC7 in the block BLK are coupled in common to word lines WL0 through WL7, respectively. In the case of not specifying word lines WL0 to WL7, the word lines will be hereinafter indicated as a word line WL or word lines WL.

The drains of select transistors ST1 of the respective NAND strings NS in the string unit SU are coupled to different bit lines BL0 to BL(L-1) (L representing an integer of two or more). In the case of not specifying bit lines BL0 to BL(L-1), the bit lines will be hereinafter indicated as a bit line BL or bit lines BL. Each bit line BL couples together its corresponding NAND strings NS in the string units SU throughout the plurality of blocks BLK. The sources of select transistors ST2 are coupled in common to a source line SL. That is, each of the string units SU is an assembly of the NAND strings NS coupled to different bit lines BL and coupled to the same select gate line SGD. Each of the blocks BLK is an assembly of the plurality of string units SU sharing the word lines WL. The memory cell array 18 is an assembly of the plurality of blocks BLK sharing the bit lines BL.

Data write and read operations are performed in a batch on the memory cell transistor MC coupled to one of the word lines WL in one of the string units SU. A group of memory cell transistors MC selected in a batch in data write and read operations will be hereinafter referred to as a "memory cell group MCG." A set of 1-bit data written to or read from one memory cell group MCG is referred to as a "page."

The memory cell array 18 may have other configurations. That is, the configuration of the memory cell array 18 is described, for example, in U.S. patent application Ser. No. 12/407,403 entitled "THREE DIMENSIONAL STACKED NONVOLATILE SEMICONDUCTOR MEMORY" filed on Mar. 19, 2009. The configuration of the memory cell array 18 is also described in U.S. patent application Ser. No. 12/406,524 entitled "THREE DIMENSIONAL STACKED NONVOLATILE SEMICONDUCTOR MEMORY" filed on Mar. 18, 2009, in U.S. patent application Ser. No. 12/679,991 entitled "NON-VOLATILE SEMICONDUCTOR STORAGE DEVICE AND METHOD OF MANUFACTURING THE SAME" filed on Mar. 25, 2010, and in U.S. patent application Ser. No. 12/532,030 entitled "SEMICONDUCTOR MEMORY AND METHOD FOR MANUFACTURING SAME" filed on Mar. 23, 2009. The entire contents of these patent applications are incorporated herein by reference.

1.1.4. Cross-Sectional Configuration of Memory Cell Array

Figure 4:
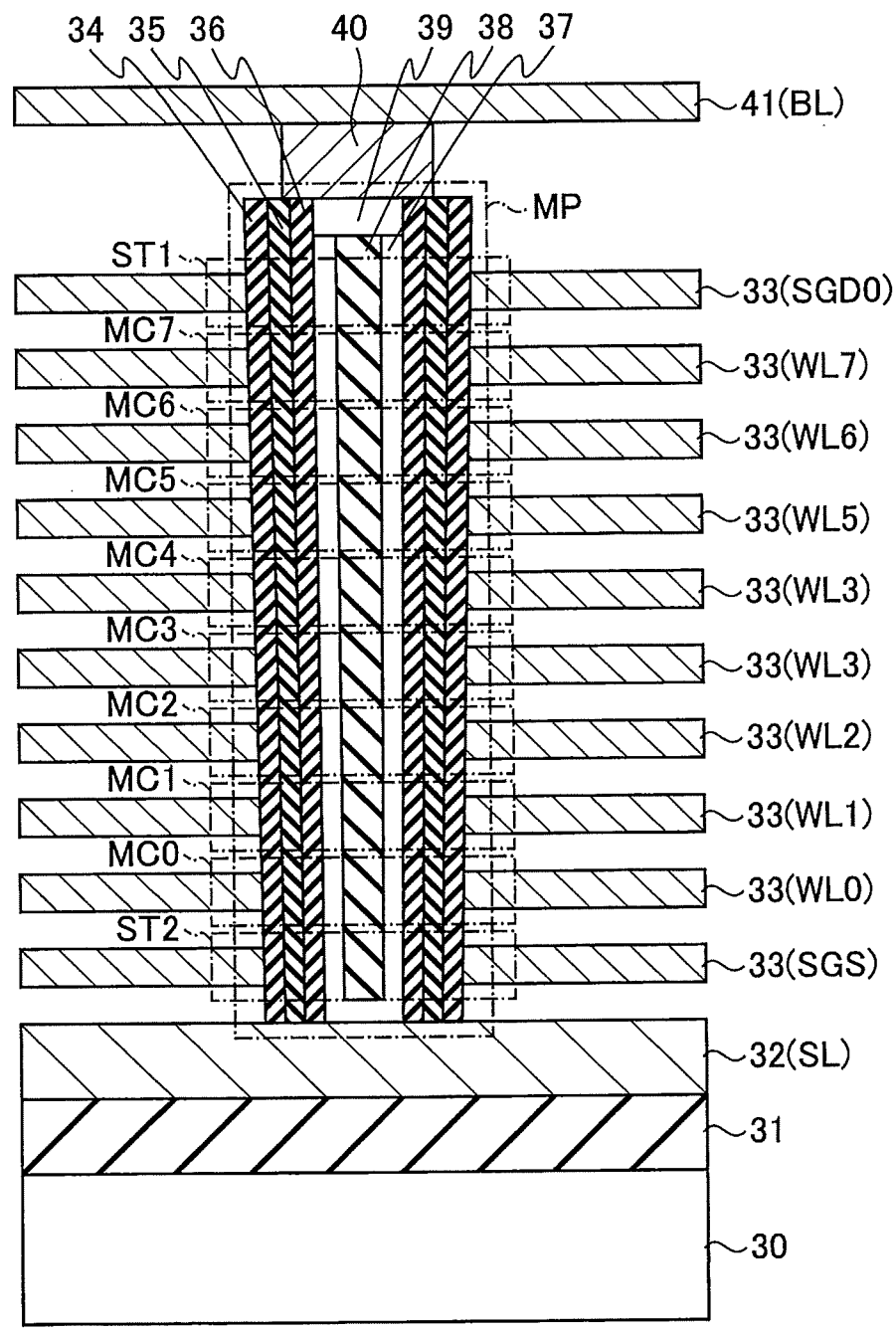
FIG. 4 is a cross-sectional view of the memory cell array of the semiconductor memory device included in the memory system of the first embodiment.

Next, a cross-sectional configuration of the memory cell array 18 will be described with reference to FIG. 4. The example of FIG. 4 shows a cross section of one NAND string NS. In FIG. 4, some interlayer insulating films are omitted.

As shown in FIG. 4, an insulating layer 31 is formed on a semiconductor substrate 30. For example, a silicon oxide film ($SiO_2$) is used for the insulating layer 31. A circuit such as the row decoder 19 or the sense amplifier 20 may be provided in a region where the insulating layer 31 is formed, that is, between the semiconductor substrate 30 and an interconnect layer 32.

The interconnect layer 32 functioning as the source line SL is formed on the insulating layer 31. The interconnect layer 32 is made of a conductive material, such as a semiconductor material containing impurities or a metallic material.

For example, ten interconnect layers 33 functioning as select gate line SGS, word lines WL0 to WL7, and select gate line SGD are sequentially stacked above the interconnect layer 32, with an interlayer insulating film (not shown in the figure) interposed between the respective interconnect layers 33.

The interconnect layers 33 are made of a conductive material, such as a semiconductor material containing impurities or a metallic material. For example, a stacking structure of titanium nitride (TiN)/tungsten (W) is employed for the interconnect layers 33. TiN functions as a barrier layer for preventing reaction between W and $SiO_2$ or an adhesion layer for improving adhesiveness of W when forming W into a film by chemical vapor deposition (CVD), for example.

A memory pillar MP passing through the ten interconnect layers 33 to reach the interconnect layer 32 is formed. One memory pillar MP corresponds to one NAND string NS. The memory pillar MP includes a block insulating film 34, a charge storage layer 35, a tunnel insulating film 36, a semiconductor layer 37, a core layer 38, and a cap layer 39.

More specifically, a hole corresponding to the memory pillar MP is formed to pass through the interconnect layers 33 so that a bottom face of the hole reaches the interconnect layer 32. The block insulating film 34, the charge storage layer 35, and the tunnel insulating film 36 are sequentially stacked on a side face of the hole. The semiconductor layer 37 is formed so that its side face contacts the tunnel insulating film 36 and its bottom face contacts the interconnect layer 32. The semiconductor layer 37 is a region where channels of the memory cell transistors MC and select transistors ST1 and ST2 are formed. Therefore, the semiconductor layer 37 functions as a signal line coupling the current paths of select transistor ST2, memory cell transistors MC0 through MC7, and select transistor ST1. The core layer 38 is provided in the semiconductor layer 37. The cap layer 39, a side face of which contacts the tunnel insulating film 36, is formed on the semiconductor layer 37 and the core layer 38.

For example, $SiO_2$ is used for the block insulating film 34, the tunnel insulating film 36, and the core layer 38. A silicon nitride film (SiN), for example, is used for the charge storage layer 35. Polysilicon, for example, is used for the semiconductor layer 37 and the cap layer 39.

A contact plug 40 is formed on the cap layer 39, and an interconnect layer 41 that functions as the bit line BL is formed on the contact plug 40. The contact plug 40 and the interconnect layer 41 are made of a conductive material and employ, for example, a stacking structure of titanium (Ti)/TiN/W.

In the example of FIG. 4, one interconnect layer 33 functioning as select gate line SGD and one interconnect layer 33 functioning as select gate line SGS are provided, but a plurality of layers may be provided.

The memory pillar MP and the eight interconnect layers 33 functioning as word lines WL0 to WL7 form memory cell transistors MC0 to MC7, respectively. Likewise, the memory pillar MP and the two interconnect layers 33 functioning as select gate lines SGD and SGS form select transistors ST1 and ST2, respectively.

1.2. Threshold Distributions of Memory Cell Transistors

Figure 5:
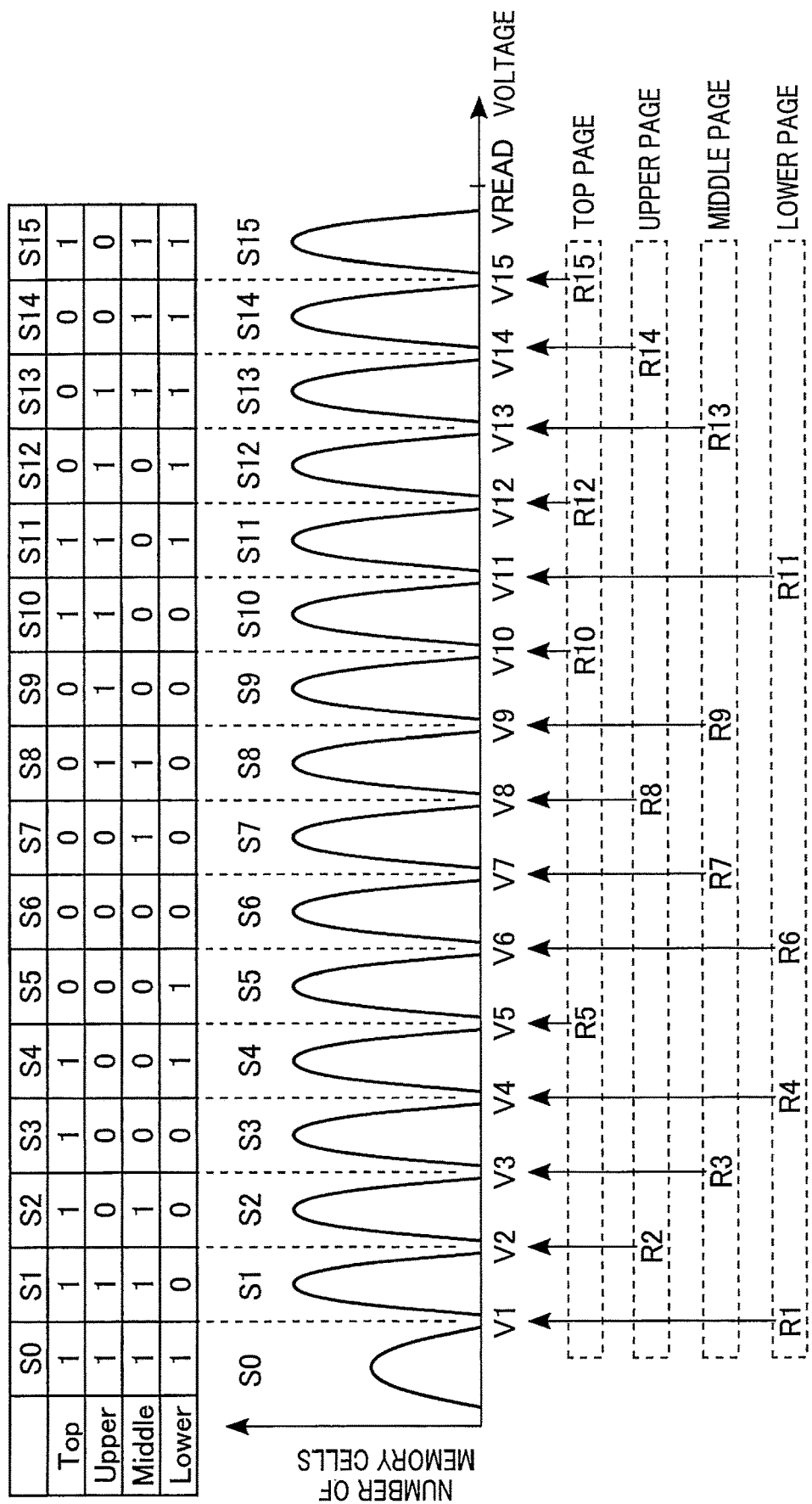
FIG. 5 is a threshold distribution diagram for memory cell transistors of the semiconductor memory device included in the memory system of the first embodiment.

Next, threshold distributions (also referred to as threshold voltage regions) for the memory cell transistors MC will be described with reference to FIG. 5. FIG. 5 shows storable data of each memory cell transistor MC, threshold distributions, and voltages used in a read operation.

In the present embodiment, one memory cell transistor MC can hold 4-bit data, as shown in FIG. 5. Namely, the memory cell transistors MC of the present embodiment are quad level cells (QLCs) that hold 4-bit data. In the case of QLC, the threshold voltage distributions thereof are divided into 16 levels. The 16 levels of threshold distributions are indicated as "S0" level to "S15" level in ascending order of threshold voltage. The present embodiment can be applied to a memory cell transistor MC that can hold data of three bits or higher. Namely, the memory cell transistors MC can hold n-bit data (n representing an integer of three or more), and in this case, the threshold voltage distributions are divided into $2^n$ levels.

Voltages V1 to V15 shown in FIG. 5 are respectively used in a verification operation for the "S0" level to the "S15" level during a write operation. Voltage VREAD is a voltage applied to an unselected word line during a read operation. The memory cell transistors MC are turned on when voltage VREAD is applied to the gate irrespective of the data held. The relationship among those voltage values is as follows: V1<V2<V3<V4<V5<V6<V7<V8<V9<V10<V11<V12<V13<V14<V15<VREAD.

The "S0" level among the above-described threshold distributions corresponds to an erase state of the memory cell transistors MC. The threshold voltage at the "S0" level is lower than voltage V1. The threshold voltage at the "S1" level is equal to or higher than voltage V1, and is lower than voltage V2. The threshold voltage at the "S2" level is equal to or higher than voltage V2, and is lower than voltage V3. The threshold voltage at the "S3" level is equal to or higher than voltage V3, and is lower than voltage V4. The threshold voltage at the "S4" level is equal to or higher than voltage V4, and is lower than voltage V5. The threshold voltage at the "S5" level is equal to or higher than voltage V5, and is lower than voltage V6. The threshold voltage at the "S6" level is equal to or higher than voltage V6, and is lower than voltage V7. The threshold voltage at the "S7" level is equal to or higher than voltage V7, and is lower than voltage V8. The threshold voltage at the "S8" level is equal to or higher than voltage V8, and is lower than voltage V9. The threshold voltage at the "S9" level is equal to or higher than voltage V9, and is lower than voltage V10. The threshold voltage at the "S10" level is equal to or higher than voltage V10, and is lower than voltage V11. The threshold voltage at the "S11" level is equal to or higher than voltage V11, and is lower than voltage V12. The threshold voltage at the "S12" level is equal to or higher than voltage V12, and is lower than voltage V13. The threshold voltage at the "S13" level is equal to or higher than voltage V13, and is lower than voltage V14. The threshold voltage at the "S14" level is equal to or higher than voltage V14, and is lower than voltage V15. The threshold voltage at the "S15" level is equal to or higher than voltage V15, and is lower than voltage VREAD. Namely, the "S0" to "S15" levels are 16 threshold voltage regions defined in ascending order of threshold voltage.

In the read operation of the present embodiment, a case of using a verify voltage as read voltage VCGRV is described as an example for the sake of simplicity. The read operations employing voltages V1 to V15 will be hereinafter referred to as R1 to R15 read operations, respectively. The R1 read operation determines whether or not the threshold voltage of the memory cell transistors MC is lower than voltage V1. The R2 read operation determines whether or not the threshold voltage of the memory cell transistors MC is lower than voltage V2. The R3 read operation determines whether or not the threshold voltage of the memory cell transistors MC is lower than voltage V3. The same applies to the R4 to R15 read operations.

The above-described 16 levels of threshold distributions are formed by writing 4-bit data composed of a lower bit, middle bit, upper bit, and top bit. The 16 levels of threshold distributions correspond to different 4-bit data. In the present embodiment, data is allocated to the "top bit/upper bit/middle bit/lower bit" for the memory cell transistors MC included in each level, as described below.

The memory cell transistors MC included in the "S0" level hold "1111" data. The memory cell transistors MC included in the "S1" level hold "1110" data. The memory cell transistors MC included in the "S2" level hold "1010" data. The memory cell transistors MC included in the "S3" level hold "1000" data. The memory cell transistors MC included in the "S4" level hold "1001" data. The memory cell transistors MC included in the "S5" level hold "0001" data. The memory cell transistors MC included in the "S6" level hold "0000" data. The memory cell transistors MC included in the "S7" level hold "0010" data. The memory cell transistors MC included in the "S8" level hold "0110" data. The memory cell transistors MC included in the "S9" level hold "0100" data. The memory cell transistors MC included in the "S10" level hold "1100" data. The memory cell transistors MC included in the "S11" level hold "1101" data. The memory cell transistors MC included in the "S12" level hold "0101" data. The memory cell transistors MC included in the "S13" level hold "0111" data. The memory cell transistors MC included in the "S14" level hold "0011" data. The memory cell transistors MC included in the "S15" level hold "1011" data. Data allocated to each level are not limited thereto.

In the case of reading data allocated in this manner, the lower bit is determined by the read operations including the "S1," "S4," "S6," and "S11" levels, that is, the R1, R4, R6, and R11 read operations. The middle bit is determined by the read operations including the "S3," "S7," "S9," and "S13" levels, that is, the R3, R7, R9, and R13 read operations. The upper bit is determined by the read operations including the "S2," "S8," and "S14" levels, that is, the R2, R8, and R14 read operations. The top bit is determined by the read operations including the "S5," "S10," "S12," and "S15" levels, that is, the R5, R10, R12, and R15 read operations. Namely, the values of the lower bit, middle bit, upper bit, and top bit are determined by four read operations, four read operations, three read operations, and four read operations, respectively. Such allocation will be hereinafter indicated as a 4-4-3-4 code.

1.3. Tracking Operation of Read Voltage

Next, a tracking operation of a read voltage will be described. The tracking operation determines a place where a valley between two adjacent threshold distributions is formed when the two adjacent threshold distributions overlap each other, that is, an intersection point of two threshold distributions, and computes, from the obtained intersection point, a suitable read voltage, that is, a shift amount. Alternatively, the tracking operation searches for, instead of the intersection point, a voltage at which the number of fail bits in the ECC processing becomes a minimum or a voltage at which error correction by the ECC processing becomes possible as the read voltage is changed. The tracking operation will be briefly described below by showing, as an example, the case of computing an intersection point between two threshold distributions respectively corresponding to the "S0" level and the "S1" level.

Figure 6:
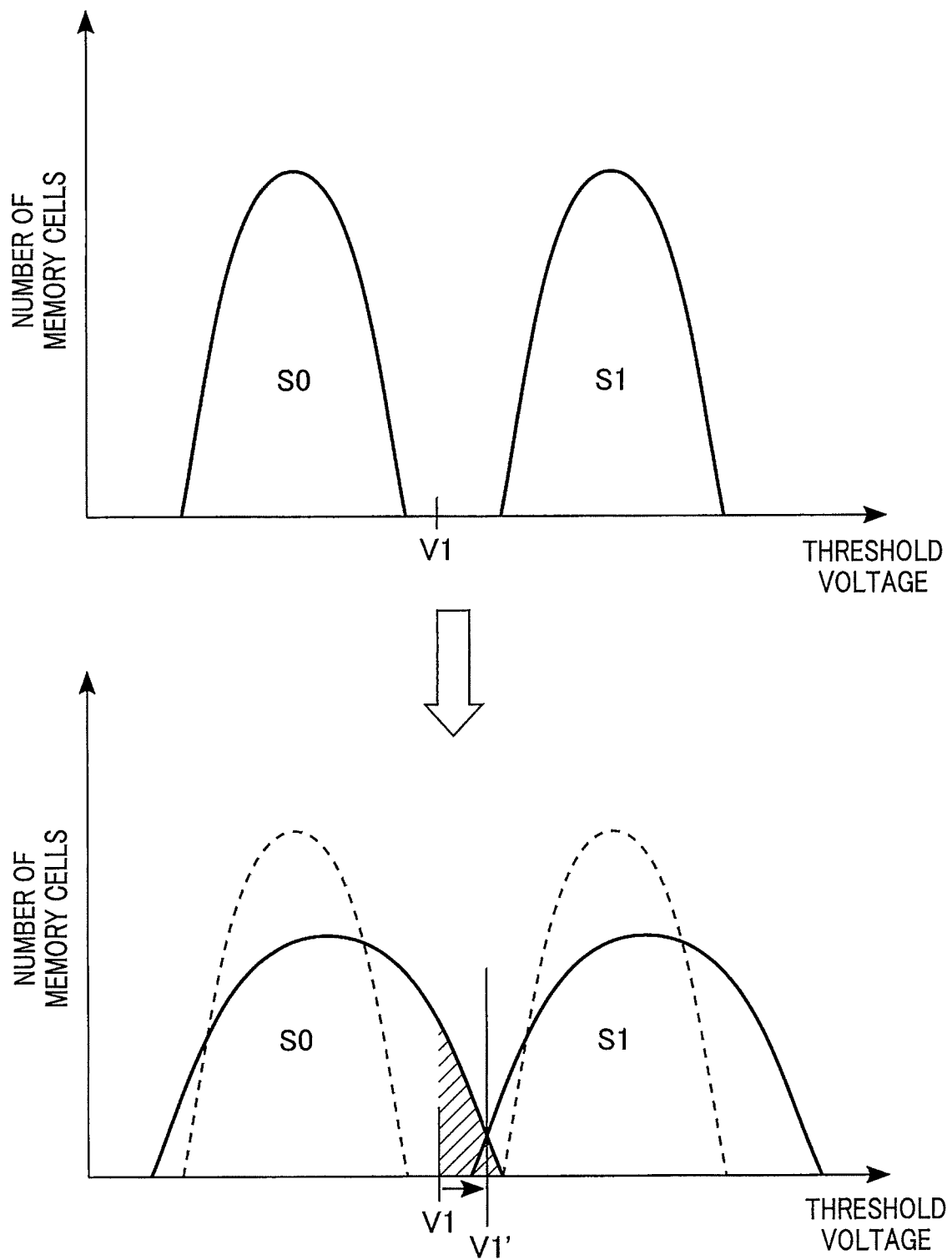
FIG. 6 is a diagram illustrating a shift of threshold distributions of the memory cell transistors of the semiconductor memory device included in the memory system of the first embodiment.

FIG. 6 shows the threshold distributions at the "S0" level and the "S1" level, as an example. Let us assume the following: the threshold distributions immediately after a data write operation is, for example, as shown in the upper figure in FIG. 6; and the distribution widths of the threshold distributions are increased by a disturbance, etc., as shown in the lower figure in FIG. 6. When a read operation is performed at voltage V1, the data of the memory cell transistors MC corresponding to the shaded area of the lower figure in FIG. 6 becomes a fail bit. If the number of fail bits generated exceeds the number of correctable error bits of the ECC circuit 260, it is difficult to correctly read data. Accordingly, the position (voltage) of the intersection point (valley) where the two threshold distributions overlap each other is searched for, and a voltage nearby is determined as suitable read voltage V1'. This operation is the tracking operation.

Figure 7:
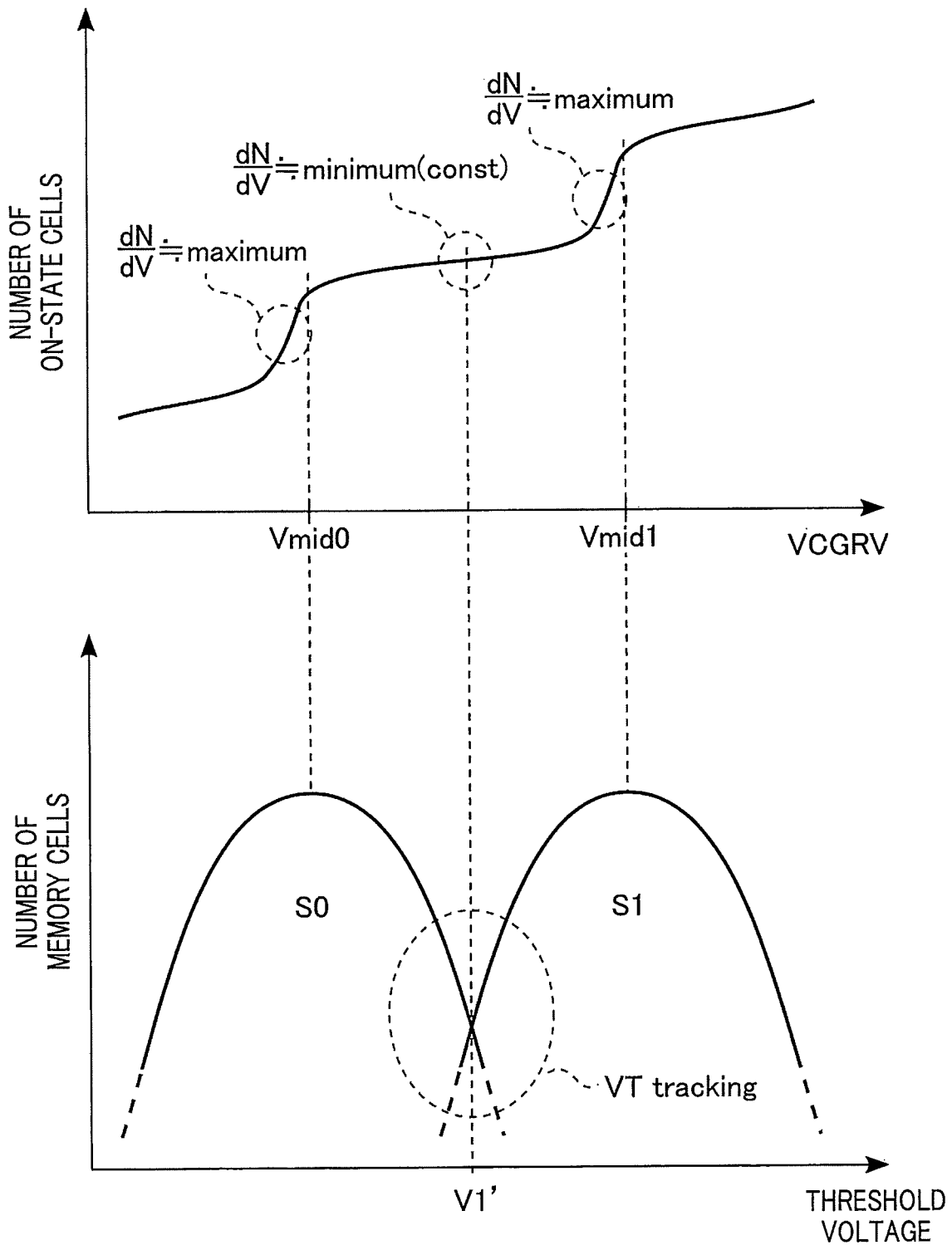
FIG. 7 is a diagram illustrating a change in the number of on-state cells in the semiconductor memory device included in the memory system of the first embodiment.

Next, the tracking operation will be described in detail with reference to FIG. 7. FIG. 7 is a graph showing the number of on-state cells (a cumulative value of the number of on-state memory cells) with respect to read voltage VCGRV, and showing the threshold distributions at the "S0" level and the "S1" level corresponding thereto.

As shown in the upper figure in FIG. 7, as voltage VCGRV is increased, the number of on-state cells increases rapidly at a slightly smaller voltage than voltage Vmid0, which is a medium value (voltage with the highest distribution probability) of the "S0" level, and dN/dV becomes a maximum (wherein N represents the number of on-state cells, and V represents voltage VCGRV of a selected word line WL). As voltage VCGRV is further increased, the increase rate of the number of on-state cells is decreased and becomes a minimum at a certain value. The increase rate with respect to voltage VCGRV becomes zero when the threshold distribution at the "S0" level and the threshold distribution at the "S1" level do not overlap each other. When the threshold distribution at the "S0" level and the threshold distribution at the "S1" level overlap each other, the increase rate with respect to voltage VCGRV becomes a certain minimum value that is not zero (>0). As voltage VCGRV is further increased, the increase rate of the number of on-state cells is increased again, and dN/dV again becomes a maximum at a slightly smaller voltage than voltage Vmid1, which is a medium value of the "S1" level.

The threshold distributions shown in the lower figure in FIG. 7 can be obtained by the above-described changes of the number of on-state cells. Namely, the threshold distributions are obtained in which voltages slightly larger than the voltages at which dN/dV becomes a maximum are medium values of the "S0" level and the "S1" level, and the voltage at which dN/dV becomes a minimum is an intersection point between the "S0" level and the "S1" level. The voltage at the intersection point, that is, voltage VCGRV at which the increase rate of the number of on-state cells becomes a minimum is voltage V1' to be found.

Figure 8:
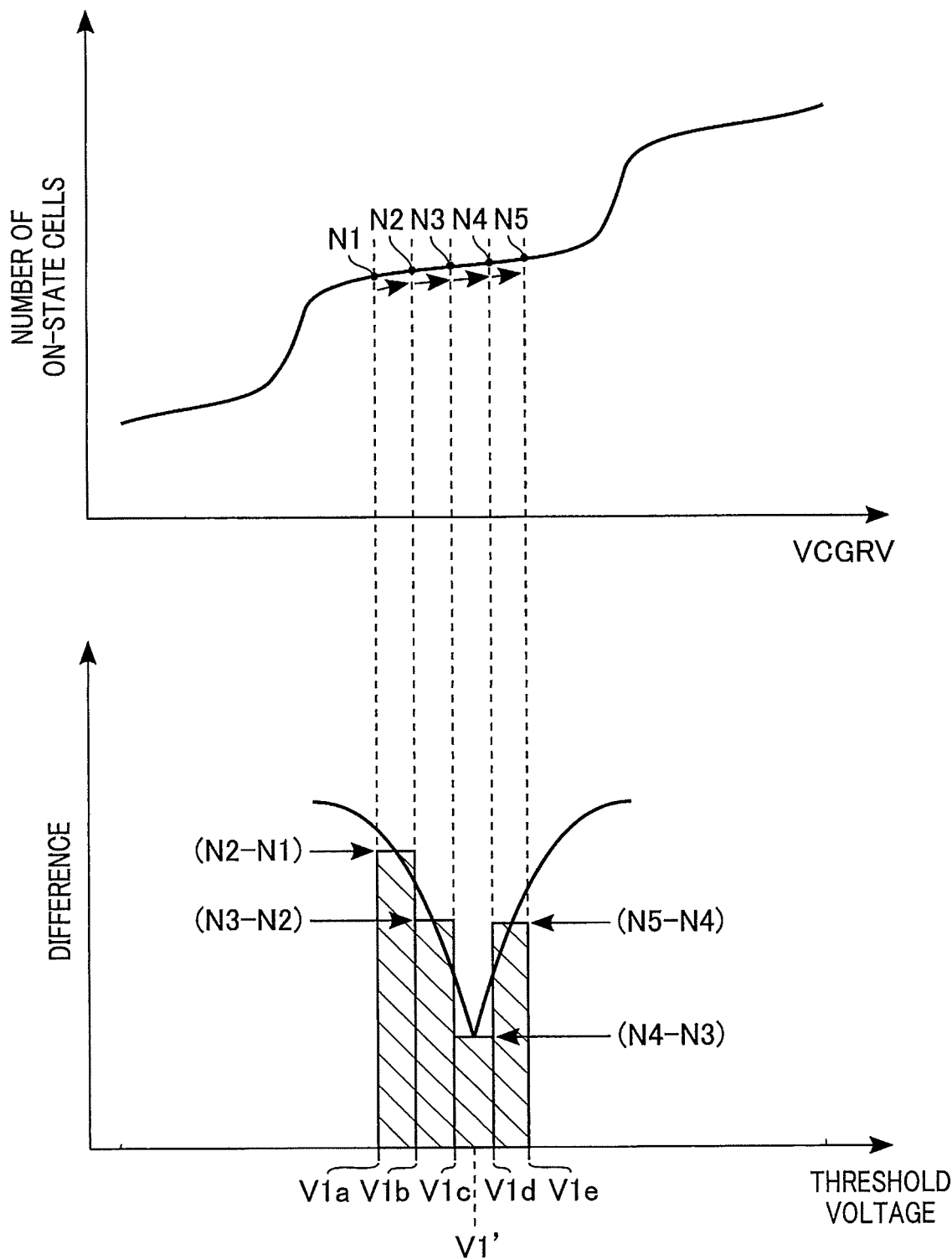
FIG. 8 is a conceptual diagram illustrating a tracking operation of the semiconductor memory device included in the memory system of the first embodiment.

An example of a specific operation of the tracking will be described with reference to FIG. 8. The upper figure in FIG. 8 shows the number of on-state cells (the total number of on-state memory cells) with respect to voltage VCGRV. The lower figure in FIG. 8 shows a histogram showing the number of memory cells turned on for the first time when the voltage of the word line WL is shifted by one step, and shows threshold distributions obtained by the histogram.

As shown in the upper figure in FIG. 8, read operations are performed multiple times while shifting read voltage VCGRV for one level (hereinafter, these read operations will be referred to as a "shift read operation"). More specifically, a read operation is first performed using voltage V1$a$ shifted from predetermined voltage V1 by a certain amount. The number of on-state cells at this time is N1. Next, a read operation is performed using voltage V1$b$ shifted from voltage V1$a$ by $\Delta$V1 in a positive direction. The number of on-state cells at this time is N2. Next, a read operation is performed using voltage V1$c$ shifted from voltage V1$b$ by $\Delta$V1 in a positive direction. The number of on-state cells at this time is N3. Next, a read operation is performed using voltage V1$d$ shifted from voltage V1$c$ by $\Delta$V1 in a positive direction. The number of on-state cells at this time is N4. Next, a read operation is performed using voltage V1$e$ shifted from voltage V1$d$ by $\Delta$V1 in a positive direction. The number of on-state cells at this time is N5.

Then, the number of memory cells newly turned on when a voltage of a selected word line increases from voltage V1$a$ to voltage V1$b$ is (N2−N1). The number of memory cells newly turned on when the voltage of the selected word line increases from voltage V1$b$ to voltage V1$c$ is (N3−N2). The number of memory cells newly turned on when the voltage of the selected word line increases from voltage V1$c$ to voltage V1$d$ is (N4−N3). The number of memory cells newly turned on when the voltage of the selected word line increases from voltage V1$d$ to voltage V1$e$ is (N5−N4).

When the relationship of the number of memory cells is (N2−N1)>(N3−N2)>(N4−N3) and (N4−N3)<(N5−N4), for example, the histogram shown in the lower figure in FIG. 8 is obtained.

As a result, the threshold distributions shown in the lower figure in FIG. 8 are estimated. Based on the distributions, the controller 200 estimates that the area between voltages V1$c$ and V1$d$ is the position where dN/dV becomes a minimum, as illustrated in FIG. 7, and sets the value between voltages V1$c$ and V1$d$ as suitable read voltage V1'.

1.4. Patrol Operation

Next, a patrol operation will be described. A patrol operation of the present embodiment generally includes a read operation of separation data, a shift read operation, a tracking operation, and estimation processing of a read voltage.

Separation data is used to separate read data into multiple levels when multilevel data is read in one read operation in a shift read operation. The read operation of the separation data is performed for each corresponding level (hereinafter, a read operation for one level will be referred to as a "single read operation"). Namely, the separation data is read in the single read operation.

The estimation processing is to estimate, from a result of the tracking operation based on the shift read operation, a read voltage corresponding to a level not included in the shift read operation. The estimation processing will be detailed later.

1.4.1. Shift Read Operation

First, the shift read operation of the patrol operation will be described with reference to FIG. 9.

Figure 9:
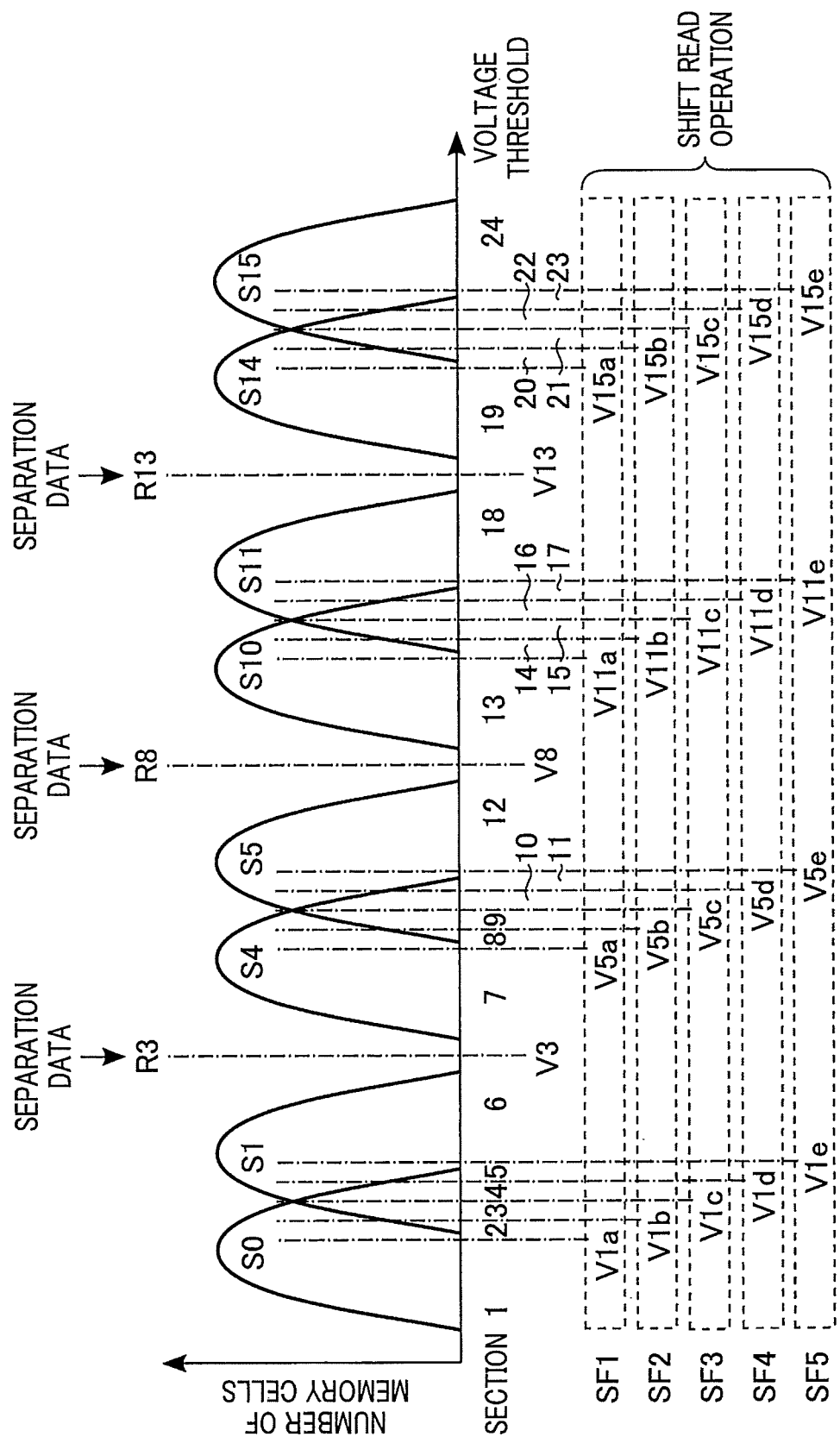
FIG. 9 is a conceptual diagram illustrating a shift read operation in a patrol operation of the memory system of the first embodiment.

In the present embodiment, the shift read operation is not limited to the levels included in the lower page, middle page, upper page, or top page, but includes the "S1," "S5," "S11," and "S15" levels, which are discretionarily set, as shown in FIG. 9. Namely, read operations corresponding to the R1, R5, R11, and R15 read operations (hereinafter also referred to as a "tracking level read operation") are performed multiple times (e.g., five times). The number of times of the tracking level read operation of the shift read operation may be discretionarily set. Also, the levels set in the tracking level read operation are not limited to the "S1," "S5," "S11," and "S15" levels. It is sufficient as long as the tracking level read operation includes two or more levels. To reduce the number of fail bits in the top page and the lower page, the tracking level read operation preferably includes the "S1" and "S15" levels, that is, minimum voltage V1 and maximum voltage V15.

When the voltages obtained by shifting voltage V1, for example, five times in association with the "S1" level (R1 read operation) are defined as V1$a$ to V1$e$, the relationship V1$a$<V1$b$<V1$c$<V1$d$<V1$e$ is obtained. When the voltages obtained by shifting voltage V5, for example, five times in association with the "S5" level (R5 read operation) are defined as V5$a$ to V5$e$, the relationship V5$a$<V5$b$<V5$c$<V5$d$<V5$e$ is obtained. When the voltages obtained by shifting voltage V11, for example, five times in association with the "S11" level (R11 read operation) are defined as V11$a$ to V11$e$, the relationship V11$a$<V11$b$<V11$c$<V11$d$<V11$e$ is obtained. When the voltages obtained by shifting voltage V15, for example, five times in association with the "S15" level (R15 read operation) are defined as V15$a$ to V15$e$, the relationship V15$a$<V15$b$<V15$c$<V15$d$<V15$e$ is obtained. The shift amounts of the respective voltages may be the same or different from one another. More specifically, the amount of shift from voltage V1a to voltage V1b, the amount of shift from voltage V1b to voltage V1c, the amount of shift from voltage V1c to voltage V1d, and the amount of shift from voltage V1d to voltage V1e, for example, may be the same or different from one another. Each voltage is discretionarily set by the controller 200.

When the five tracking level read operations are indicated as shift SF1 to shift SF5, respectively, in the shift read operation, a tracking level read operation based on voltages V1a, V5a, V11a, and V15a is performed in shift SF1. In shift SF2, a tracking level read operation based on voltages V1b, V5b, V11b, and V15b is performed. In shift SF3, a tracking level read operation based on voltages V1c, V5c, V11c, and V15c is performed. In shift SF4, a tracking level read operation based on voltages V1d, V5d, V11d, and V15d is performed. In shift SF5, a tracking level read operation based on voltages V1e, V5e, V11e, and V15e is performed.

Also, to separate the "S1," "S5," "S11," and "S15" levels, three single read operations corresponding to the "S3," "S8," and "S13" levels (i.e., the R3, R8, and R13 read operations), respectively, are, for example, performed, and read data is used as separation data. A level corresponding to the separation data, that is, a read voltage of the separation data may be discretionarily set. For example, a middle read voltage not included in the threshold distribution at the "S1" level and the threshold distribution at the "S4" level is set instead of voltage V3 corresponding to the R3 read operation. Likewise, a middle read voltage not included in the threshold distribution at the "S5" level and the threshold distribution at the "S10" level is set instead of voltage V8 corresponding to the R8 read operation. A middle read voltage not included in the threshold distribution at the "S11" level and the threshold distribution at the "S14" level is set instead of voltage V13 corresponding to the R13 read operation.

In the example of FIG. 9, the threshold voltages of the memory cell transistors MC are divided into 24 sections in association with the respective read voltages of the shift read operations and the separation data. More specifically, the threshold voltage in section 1 is lower than voltage V1a. The threshold voltage in section 2 is equal to or higher than voltage V1a, and is lower than voltage V1b. The threshold voltage in section 3 is equal to or higher than voltage V1b, and is lower than voltage V1c. The threshold voltage in section 4 is equal to or higher than voltage V1c, and is lower than voltage V1d. The threshold voltage in section 5 is equal to or higher than voltage V1d, and is lower than voltage V1e. The threshold voltage in section 6 is equal to or higher than voltage V1e, and is lower than voltage V3. The threshold voltage in section 7 is equal to or higher than voltage V3, and is lower than voltage V5a. The threshold voltage in section 8 is equal to or higher than voltage V5a, and is lower than voltage V5b. The threshold voltage in section 9 is equal to or higher than voltage V5b, and is lower than voltage V5c. The threshold voltage in section 10 is equal to or higher than voltage V5c, and is lower than voltage V5d. The threshold voltage in section 11 is equal to or higher than voltage V5d, and is lower than voltage V5e. The threshold voltage in section 12 is equal to or higher than voltage V5e, and is lower than voltage V8. The threshold voltage in section 13 is equal to or higher than voltage V8, and is lower than voltage V11a. The threshold voltage in section 14 is equal to or higher than voltage V11a, and is lower than voltage V11b. The threshold voltage in section 15 is equal to or higher than voltage V11b, and is lower than voltage V11c. The threshold voltage in section 16 is equal to or higher than voltage V11c, and is lower than voltage V11d. The threshold voltage in section 17 is equal to or higher than voltage V11d, and is lower than voltage V11e. The threshold voltage in section 18 is equal to or higher than voltage V11e, and is lower than voltage V13. The threshold voltage in section 19 is equal to or higher than voltage V13, and is lower than voltage V15a. The threshold voltage in section 20 is equal to or higher than voltage V15a, and is lower than voltage V15b. The threshold voltage in section 21 is equal to or higher than voltage V15b, and is lower than voltage V15c. The threshold voltage in section 22 is equal to or higher than voltage V15c, and is lower than voltage V15d. The threshold voltage in section 23 is equal to or higher than voltage V15d, and is lower than voltage V15e. The threshold voltage in section 24 is equal to or higher than voltage V15e, and is lower than voltage VREAD.

1.4.2. Level Separation of Read Data

Next, level separation of data read by the shift read operation will be described with reference to FIG. 10. FIG. 10 shows, for each section, data-read results of the R3, R8, and R13 read operations (i.e., separation data) and data-read results (hereinafter also referred to as "tracking data") of the five tracking level read operations (shift SF1 to shift SF5) of the shift read operations.

As shown in FIG. 10, the separation data corresponding to the R3 read operation is "1" in sections 1 to 6, and is "0" in sections 7 to 24. The separation data corresponding to the R8 read operation is "1" in sections 1 to 12, and is "0" in sections 13 to 24. The separation data corresponding to the R13 read operation is "1" in sections 1 to 18, and is "0" in sections 19 to 24. The tracking data corresponding to shift SF1 is "1" in sections 1, 8 to 13, and 20 to 24, and is "0" in sections 2 to 7 and 14 to 19. The tracking data corresponding to shift SF2 is "1" in sections 1, 2, 9 to 14, and 21 to 24, and is "0" in sections 3 to 8 and 15 to 20. The tracking data corresponding to shift SF3 is "1" in sections 1 to 3, 10 to 15, and 22 to 24, and is "0" in sections 4 to 9 and 16 to 21. The tracking data corresponding to shift SF4 is "1" in sections 1 to 4, 11 to 16, 23, and 24, and is "0" in sections 5 to 10 and 17 to 22. The tracking data corresponding to shift SF5 is "1" in sections 1 to 5, 12 to 17, and 24, and is "0" in sections 6 to 11 and 18 to 23.

Sections 1 to 24 are divided into four groups (groups A to D) according to the separation data by the R3, R8, and R13 read operations.

When the sections in which all the results of the R3, R8, and R13 read operations are "1" are defined as group A, group A includes sections 1 to 6. When the data of the R3, R8, and R13 read operations in group A is represented by a logical formula, the relationship R3&R8&R13=1 (&; AND operation) is obtained. When the AND operation of the respective data of shift SF1 to shift SF5 and R3&R8&R13 is performed, the relationship R3&R8&R13=0 is obtained in sections 7 to 24. Therefore, the respective data of shift SF1 to shift SF5 become "0," and group A is separated. Namely, the "S0" and "S1" levels are separated. Group A includes an intersection point (valley) between the threshold distribution at the "S0" level and the threshold distribution at the "S1" level. Voltage V1' is obtained from data in sections 1 to 6 of shift SF1 to shift SF5 by performing the tracking operation of read voltage V1.

When the sections in which the results of the R3 read operation are "0" and the results of the R8 and R13 read operations are "1" are defined as group B, group B includes sections 7 to 12. When the data of the R3, R8, and R13 read operations in group B is represented by a logical formula, the relationship/R3&R8&R13=1 ("/" representing inversion data of read data) is obtained. When the AND operation of the respective data of shift SF1 to shift SF5 and /R3&R8&R13 is performed, the relationship/ R3&R8&R13=0 is obtained in sections 1 to 6 and 13 to 24. Therefore, the respective data of shift SF1 to shift SF5 become "0," and group B is separated. Namely, the "S4" and "S5" levels are separated. Group B includes an intersection point (valley) between the threshold distribution at the "S4" level and the threshold distribution at the "S5" level. Voltage V5' is obtained from data in sections 7 to 12 of shift SF1 to shift SF5 by performing the tracking operation of read voltage V5.

When the sections in which the results of the R3 and R8 read operations are "0" and the results of the R13 read operation are "1" are defined as group C, group C includes sections 13 to 18. When the data of the R3, R8, and R13 read operations in group C is represented by a logical formula, the relationship/R3&/R8&R13=1 is obtained. When the AND operation of the respective data of shift SF1 to shift SF5 and /R3&/R8&R13 is performed, the relationship /R3&/R8&R13=0 is obtained in sections 1 to 12 and 19 to 24. Therefore, the respective data of shift SF1 to shift SF5 become "0," and group C is separated. Namely, the "S10" and "S11" levels are separated. Group C includes an intersection point (valley) between the threshold distribution at the "S10" level and the threshold distribution at the "S11" level. Voltage V11' is obtained from data in sections 13 to 18 of shift SF1 to shift SF5 by performing the tracking operation of read voltage V11.

When the sections in which all the results of the R3, R8, and R13 read operations are "0" are defined as group D, group D includes sections 19 to 24. When the data of the R3, R8, and R13 read operations in group D is represented by a logical formula, the relationship /R3&/R8&/R13=1 is obtained. When the AND operation of the respective data of shift SF1 to shift SF5 and /R3&/R8&/R13 is performed, the relationship /R3&/R8&/R13=0 is obtained in sections 1 to 18. Therefore, the respective data of shift SF1 to shift SF5 become "0," and group D is separated. Namely, the "S14" and "S15" levels are separated. Group D includes an intersection point (valley) between the threshold distribution at the "S14" level and the threshold distribution at the "S15" level. Voltage V15' is obtained from data in sections 19 to 24 of shift SF1 to shift SF5 by performing the tracking operation of read voltage V15.

1.4.3. Estimation Processing

Next, the estimation processing will be described. In the present embodiment, voltages V1', V5', V11', and V15' are computed by the tracking operation, and estimation processing of voltages V2' to V4', V6' to V10', and V12' to V14' is performed based on voltages V1', V5', V11', and V15'.

The amounts of shift from voltages V1 through V15 to corrected voltages V1' through V15' are defined as SV1 to SV15, respectively. Then, SV1, voltage V1, and voltage V1', for example, are in a relationship of SV1=V1'−V1. The same applies to SV2 to SV15. Since SV1, SV5, SV11, and SV15 are determined from the results of the tracking operation (voltages V1', V5', V11', and V15'), SV2 to SV4, SV6 to SV10, and SV12 to SV14 are computed, for example, using the computing equations shown below. The computing equations to compute SV2 to SV4, SV6 to SV10, and SV12 to SV14 are not limited to those shown below.

$$SV2=SV1$$

$$SV3=(SV1+SV5)/2$$

$$SV4=SV5$$

$$SV6=SV5$$

$$SV7=(2 \times SV5+SV11)/3$$

$$SV8=(SV5+SV11)/2$$

$$SV9=(SV5+2 \times SV11)/3$$

$$SV10=SV11$$

$$SV12=SV11$$

$$SV13=(SV11+SV15)/2$$

$$SV14=SV15$$

Voltages V2' to V4', V6' to V10', and V12' to V14' are estimated (computed) using the results of the equations. More specifically, in the case of obtaining voltage V2', for example, computation of V2'=V2+SV2 is performed. The same applies to other voltages V3', V4', V6' to V10', and V12' to V14'.

1.4.4. Overall Flow of Patrol Operation

Figure 11:
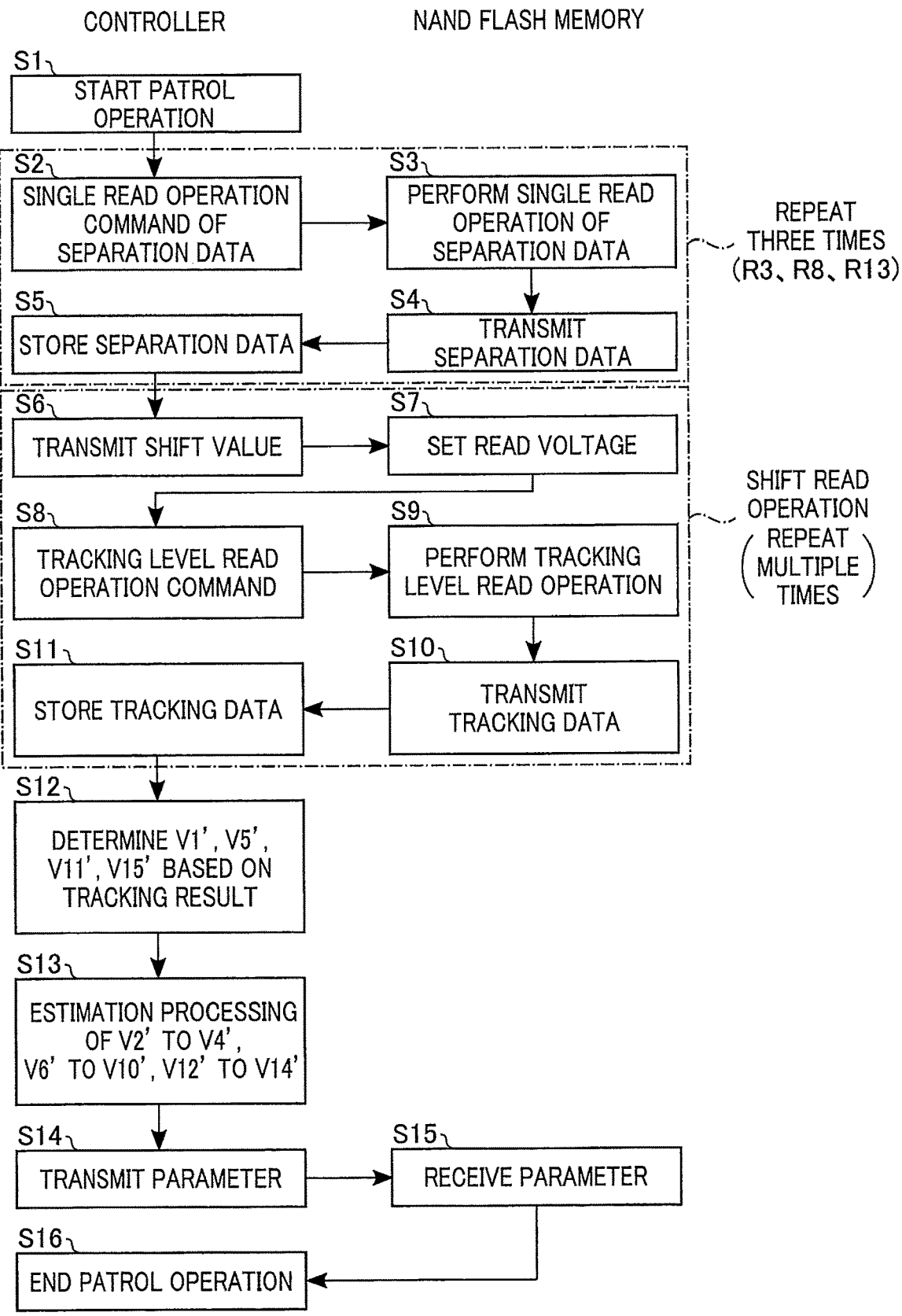
FIG. 11 is a flowchart of the patrol operation of the memory system of the first embodiment.

Next, an overall flow of the patrol operation will be described with reference to FIG. 11. The example of FIG. 11 shows the patrol operation corresponding to one word line WL. The CPU 230 may perform the patrol operation on each block BLK in the NAND flash memory 100, or may perform the patrol operation on any block BLK in the NAND flash memory 100. Also, the CPU 230 may perform the patrol operation on each word line WL in the blocks BLK, or may perform the patrol operation on any word line WL in the blocks BLK. Namely, the word lines WL may be divided into a plurality of groups, to perform the patrol operation on one word line WL in each group. In this case, voltages V1' to V15' corresponding to the block BLK and the word line WL subjected to the patrol operation are applied to the block BLK or word line WL not subjected to the patrol operation.

As shown in FIG. 11, the CPU 230 starts the patrol operation when the controller 200 is on standby, for example, in the patrol period (step S1).

First, the CPU 230 performs the single read operation three times in order to obtain separation data corresponding to the R3, R8, and R13 read operations. More specifically, the CPU 230 first issues a single read operation command corresponding to the R3 read operation, and transmits the command to the NAND flash memory 100 (step S2). The order of the R3, R8, and R13 read operations may be discretionarily set.

Upon receiving the single read operation command, the sequencer 15 performs the single read operation corresponding to the R3 read operation (step S3), and transmits read data (separation data) to the controller 200 (step S4).

Upon receiving the separation data from the NAND flash memory 100, the CPU 230 stores the separation data, for example, in the buffer memory 240 (step S5).

Likewise, the CPU 230 repeats the operations of steps S2 to S4 in association with the R8 and R13 read operations, and obtains separation data of each of them.

Next, the CPU 230 performs the shift read operation, and repeats the tracking level read operation multiple times (five times in the present example). More specifically, the CPU 230 first transmits shift values of voltages V1, V5, V11, and V15 corresponding to shift SF1 to the NAND flash memory 100 (step S6). The sequencer 15 sets voltages V1a, V5a, V11a, and V15a based on the received shift values (step S7). Next, the CPU 230 transmits a tracking level read operation command to the NAND flash memory 100 (step S8). The sequencer 15 performs the tracking level read operation based on the received command (step S9), and transmits read data (tracking data) to the controller 200 (step S10). Upon receiving the tracking data from the NAND flash memory 100, the CPU 230 stores the tracking data, for example, in the buffer memory 240 (step S11). Likewise, the CPU 230 repeats the operations of steps S6 to S11 in association with shift SF2 to shift SF5, and obtains tracking data of each of them.

The order of the single read operations (steps S2 to S5) and the shift read operations (steps S6 to S11) may be reversed. Namely, the CPU 230 may obtain separation data after performing the shift read operations.

Next, the CPU 230 performs the tracking operation based on the obtained tracking data, and determines voltages V1', V5', V11', and V15' (step S12).

Next, the CPU 230 performs the estimation processing of other voltages V2' to V4', V6' to V10', and V12' to V14' based on voltages V1', V5', V11', and V15' (step S13).

Next, the CPU 230 transmits parameters (shift values) corresponding to voltages V1' to V15' to the NAND flash memory 100 (step S14). The sequencer 15 stores the received parameters, for example, in the management region of the memory cell array 18 (step S15). The parameters may be stored in RAM 220 instead of the memory cell array 18. If there is no change to the parameters, steps S14 and S15 may be omitted.

When the parameter setting ends, the CPU230 ends the patrol operation (step S16).

1.4.5. Command Sequence

Next, a command sequence transmitted from the controller 200 to the NAND flash memory 100 will be described with reference to FIG. 12. The example of FIG. 12 is a timing chart showing transmission and reception of the signal DQ (command, address, and data) and the ready/busy signal RBn in the patrol operation.

Figure 12:
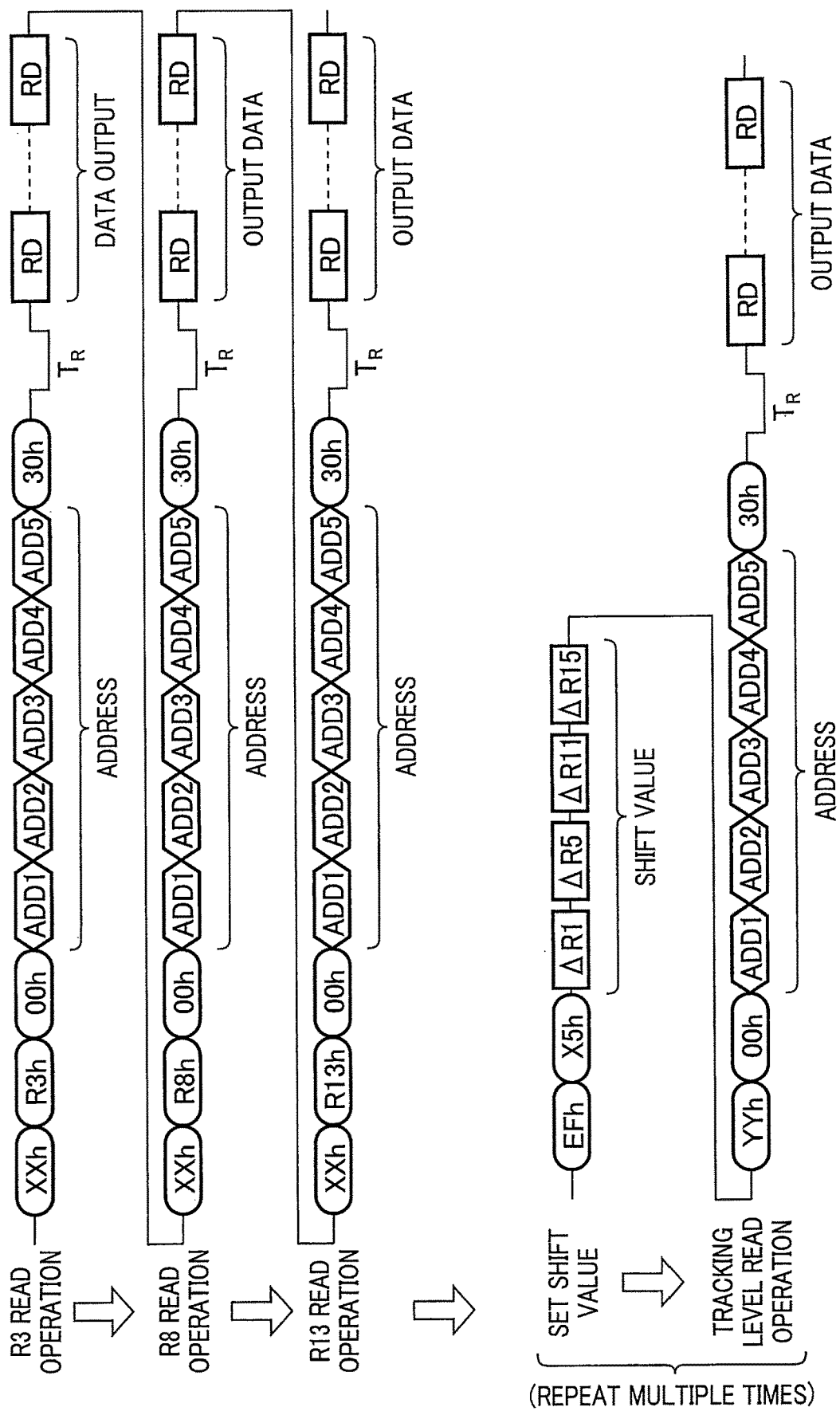
FIG. 12 is a command sequence of the patrol operation of the memory system of the first embodiment.

First, the CPU 230 transmits a command "XXh," command "R3h," "command" "00h," addresses "ADD1" to "ADD5," and command "30h" in the mentioned order to the NAND flash memory 100 in order to perform the single read operation corresponding to the R3 read operation, as shown in FIG. 12. The command "XXh" provides notification that the single read operation is to be performed. The command "R3h" provides notification that the R3 read operation is to be performed. The command "00h" provides notification that a read operation is to be performed. The command "30h" instructs execution of a read operation. In the present embodiment, the address ADD is transmitted in five cycles; however, the present embodiment is not limited thereto. It is sufficient as long as the necessary number of cycles for transmitting the address ADD is set.

Upon receiving the command "30h," the sequencer 15 performs the single read operation corresponding to the R3 read operation. During a read operation (reference symbol "$T_R$" in FIG. 12), the sequencer 15 turns the ready/busy signal RBn to an "L" level (busy state).

Upon receiving the ready/busy signal RBn at an "H" level, the CPU 230 toggles the signal REn, and reads data RD corresponding to the R3 read operation from the data register 21 of the NAND flash memory 100.

Next, the CPU 230 performs the single read operation corresponding to the R8 read operation. The CPU 230 transmits, to the NAND flash memory 100, a command "R8h" that provides notification that the R8 read operation is to be performed. The command "R8h" provides notification that the R8 read operation is to be performed. Other commands and address ADD are the same as those for the R3 read operation. As a result, the CPU 230 reads data RD corresponding to the R8 read operation from the data register 21.

Next, the CPU 230 performs the single read operation corresponding to the R13 read operation. The CPU 230 transmits, to the NAND flash memory 100, a command "R13h" that provides notification that the R13 read operation is to be performed. The command "R13h" provides notification that the R13 read operation is to be performed. Other commands and addresses ADD are the same as those for the R3 read operation. As a result, the CPU 230 reads data RD corresponding to the R13 read operation from the data register 21.

Next, the CPU 230 performs the shift read operation. More specifically, first, the CPU 230 transmits a command "EFh," command "X5h," and data "ΔR1," "ΔR5," "ΔR11," and "ΔR15" in the mentioned order to the NAND flash memory 100 in order to set a shift value (read voltage). The command "EFh" instructs parameter settings. The command "X5h" indicates selection of the "S1," "S5," "S11," and "S15" levels corresponding to the tracking level read operations. The data "ΔR1," "ΔR5," "ΔR11," and "ΔR15" indicate the shift values of voltages V1, V5, V11, and V15, respectively. Thereby, voltage V1x=V1+ΔR1 (x being one of a to e), voltage V5x=V5+ΔR5, voltage V11x=V11+ΔR11, and voltage V15x=V15+ΔR15 are, for example, set as the read voltages of the R1, R5, R11, and R15 read operations. The sequencer 15 stores these data, for example, in the management region of the memory cell array 18.

Next, the CPU 230 transmits a command "YYh," command "00h," addresses "ADD1" to "ADD5," and command "30h" in the mentioned order to the NAND flash memory 100 in order to perform the tracking level read operation based on the transmitted shift value. The command "YYh" is a prefix command indicating the tracking level read operation including the "S1," "S5," "S11," and "S15" levels, that is, including the R1, R5, R11, and R15 read operations.

Upon receiving the command "30h," the sequencer 15 performs the tracking level read operation. During a read operation, the sequencer 15 turns the ready/busy signal RBn to an "L" level.

Upon receiving the ready/busy signal RBn at an "H" level, the CPU 230 toggles the signal REn, and reads data RD (tracking data) from the data register 21 of the NAND flash memory 100.

The CPU 230 repeats the setting of the shift value and the tracking level read operation according to the number of times of the shift read operation.

1.4.6. Voltage of Selected Word Line During Patrol Operation

Figure 13:
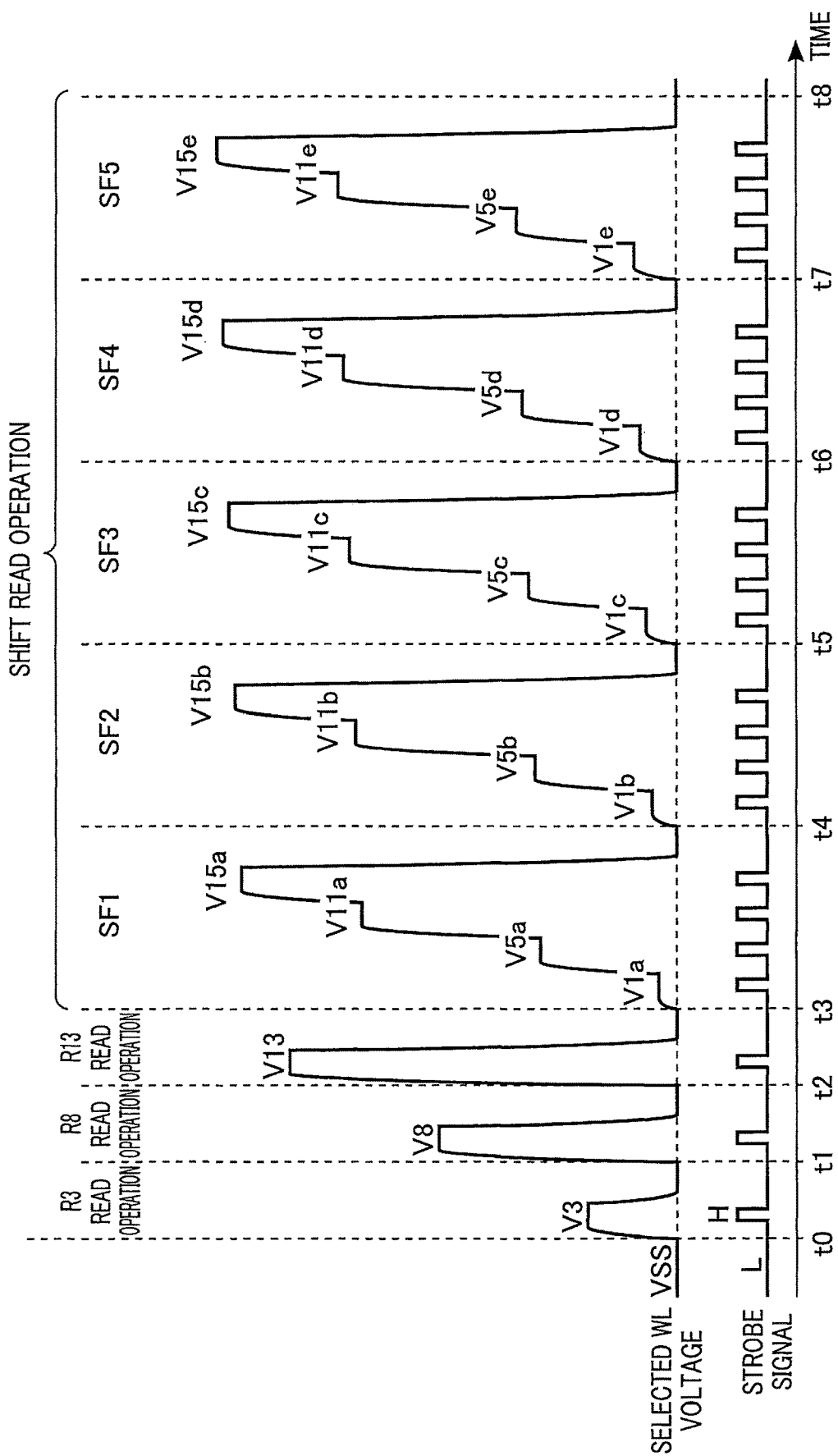
FIG. 13 is a timing chart showing voltages of a selected word line during the patrol operation in the semiconductor memory device included in the memory system of the first embodiment.

Next, a voltage of a selected word line WL during the patrol operation will be described with reference to FIG. 13. The example of FIG. 13 shows a relationship between a read voltage of a word line WL coupled to the memory cell group MCG as a target of patrol (hereinafter, this word line WL is also referred to as a "selected word line WL") and a strobe signal. The strobe signal is a control signal to be transmitted from the sequencer 15 to the sense amplifier 20, and is set to an "H" level in the sense amplifier 20 during a period of reading a voltage of a bit line.

As shown in FIG. 13, the single read operation corresponding to the R3 read operation is performed in a period of time t0 to time t1. More specifically, when the single read operation corresponding to the R3 read operation is started, the row decoder 19 applies voltage V3 to the selected word line WL. In the period when voltage V3 is being applied to the selected word line WL, the strobe signal is set to an "H" level, and data is read to the sense amplifier 20. After the strobe signal is set to an "L" level, the row decoder 19 applies voltage VSS to the selected word line WL. The read data is transmitted to the controller 200.

In a period of time t1 to time t2, the single read operation corresponding to the R8 read operation is performed. More specifically, when the single read operation corresponding to the R8 read operation is started, the row decoder 19 applies voltage V8 to the selected word line WL. The subsequent operations are the same as those of the single read operation corresponding to the R3 read operation.

In a period of time t2 to time t3, the single read operation corresponding to the R13 read operation is performed. More specifically, when the single read operation corresponding to the R13 read operation is started, the row decoder 19 applies voltage V13 to the selected word line WL. The subsequent operations are the same as those of the single read operation corresponding to the R3 read operation.

In a period of time t3 to time t4, the tracking level read operation corresponding to shift SF1 of the shift read operation is performed. More specifically, the row decoder 19 first applies voltage V1a to the selected word line WL. In the period when voltage V1a is being applied to the selected word line WL, the strobe signal is set to an "H" level, and data corresponding to voltage V1a is read to the sense amplifier 20. Next, the row decoder 19 applies voltage V5a to the selected word line WL. In the period when voltage V5a is being applied to the selected word line WL, the strobe signal is set to an "H" level, and data corresponding to voltage V5a is read to the sense amplifier 20. Next, the row decoder 19 applies voltage V11a to the selected word line WL. In the period when voltage V11a is being applied to the selected word line WL, the strobe signal is set to an "H" level, and data corresponding to voltage V11a is read to the sense amplifier 20. Next, the row decoder 19 applies voltage V15a to the selected word line WL. In the period when voltage V15a is being applied to the selected word line WL, the strobe signal is set to an "H" level, and data corresponding to voltage V15a is read to the sense amplifier 20. After the strobe signal is set to an "L" level, the row decoder 19 applies voltage VSS to the selected word line WL. Tracking data corresponding to voltages V1a, V5a, V11a, and V15a are transmitted to the controller 200.

In a period of time t4 to time t5, the tracking level read operation corresponding to shift SF2 of the shift read operation is performed. More specifically, the row decoder 19 sequentially applies voltages V1b, V5b, V11b, and V15b to the selected word line WL, as in shift SF1. The sense amplifier 20 reads data corresponding to each voltage. Tracking data corresponding to voltages V1b, V5b, V11b, and V15b are transmitted to the controller 200.

In a period of time t5 to time t6, the tracking level read operation corresponding to shift SF3 of the shift read operation is performed. More specifically, the row decoder 19 sequentially applies voltages V1c, V5c, V11c, and V15c to the selected word line WL, as in shift SF1. The sense amplifier 20 reads data corresponding to each voltage. Tracking data corresponding to voltages V1c, V5c, V11c, and V15c are transmitted to the controller 200.

In a period of time t6 to time t7, the tracking level read operation corresponding to shift SF4 of the shift read operation is performed. More specifically, the row decoder 19 sequentially applies voltages V1d, V5d, V11d, and V15d to the selected word line WL, as in shift SF1. The sense amplifier 20 reads data corresponding to each voltage. Tracking data corresponding to voltages V1d, V5d, V11d, and V15d are transmitted to the controller 200.

In a period of time t7 to time t8, the tracking level read operation corresponding to shift SF5 of the shift read operation is performed. More specifically, the row decoder 19 sequentially applies voltages V1e, V5e, V11e, and V15e to the selected word line WL, as in shift SF1. The sense amplifier 20 reads data corresponding to each voltage. Tracking data corresponding to voltages V1e, V5e, V11e, and V15e are transmitted to the controller 200.

1.5. Advantageous Effects of Present Embodiment

The configuration according to the present embodiment can improve the processing capability. This effect will be detailed below.

If the number of fail bits generated exceeds the number of correctable error bits of the ECC circuit 260 in a read operation, data cannot be read correctly. In this case, the read operation may be performed again (hereinafter referred to as a "retry read operation") after the tracking operation, by shifting the read voltage. However, if the retry read operation is performed, the processing time of the read operation will be long.

In the QLC of 4-4-3-4 code, even if the tracking operation is performed using one of the lower page, middle page, upper page, or top page, there is no page that allows effective reduction of the number of fail bits in the four pages. More specifically, for example, the proportion of the number of fail bits due to the read operation at the "S15" level is relatively large in the top page, and the proportion of the number of fail bits due to the read operation at the "S1" level is relatively large in the lower page. In contrast, when the tracking operation is performed using the top page, for example, voltage V1' is estimated from the "S5" level, that is, voltage V5', and therefore the possibility that voltage V1' deviates from the valley position between the threshold distribution at the "S0" level and the threshold distribution at the "S1" level increases, and the reduction rate of the number of fail bits in the lower page decreases. Also, when the tracking operation is performed using the lower page, voltage V15' is estimated from the "S11" level, that is, voltage V11', and therefore the possibility that voltage V15' deviates from the valley position between the threshold distribution at the "S14" level and the threshold distribution at the "S15" level increases, and the reduction rate of the number of fail bits in the top page decreases. Likewise, when the tracking operation is performed using the upper page and the middle page, voltage V1' and voltage V15' are determined by the estimation, and therefore the possibility that voltage V1' and voltage V15' deviate from the valley position increases.

In contrast, according to the configuration of the present embodiment, the patrol operation includes the read operation of separation data, the shift read operation, the tracking operation, and the estimation processing of a read voltage. Also, in the shift read operation, read operations including discretionarily set levels can be performed without being limited to the levels included in the lower page, middle page, upper page, or top page. More specifically, the read operations including the "S1," "S5," "S11," and "S15" levels, for example, can be performed. In this case, since the "S1" level and the "S15" level are included, minimum voltage V1' and maximum voltage V15' of the read voltage are determined by the tracking operation. Therefore, the possibility that voltage V1' and voltage V15' deviate from the valley position decreases, allowing an increase of the reduction rate of the number of fail bits. Since the read voltage can be optimized by the patrol operation, the number of fail bits can be reduced in a normal read operation, allowing a decrease of the frequency of occurrence of the retry read operation. Therefore, the increase of the processing time of the read operation can be suppressed, and the processing capability of the memory system can be improved.

Also, the patrol operation can be performed during a free time (standby state) of the memory system. As a result, a decrease of the processing capability of the memory system due to the tracking operation can be suppressed.

2. Second Embodiment

Next, a second embodiment will be described. In the second embodiment, a case in which the NAND flash memory 100 applies on-chip tracking to perform the tracking operation will be described. Hereinafter, mainly the matters different from the first embodiment will be described.

2.1. On-Chip Tracking

First, the on-chip tracking will be described with reference to FIG. 14. The example of FIG. 14 shows a case where the on-chip tracking is applied when performing the single read operation corresponding to the R1 read operation.

Figure 14:
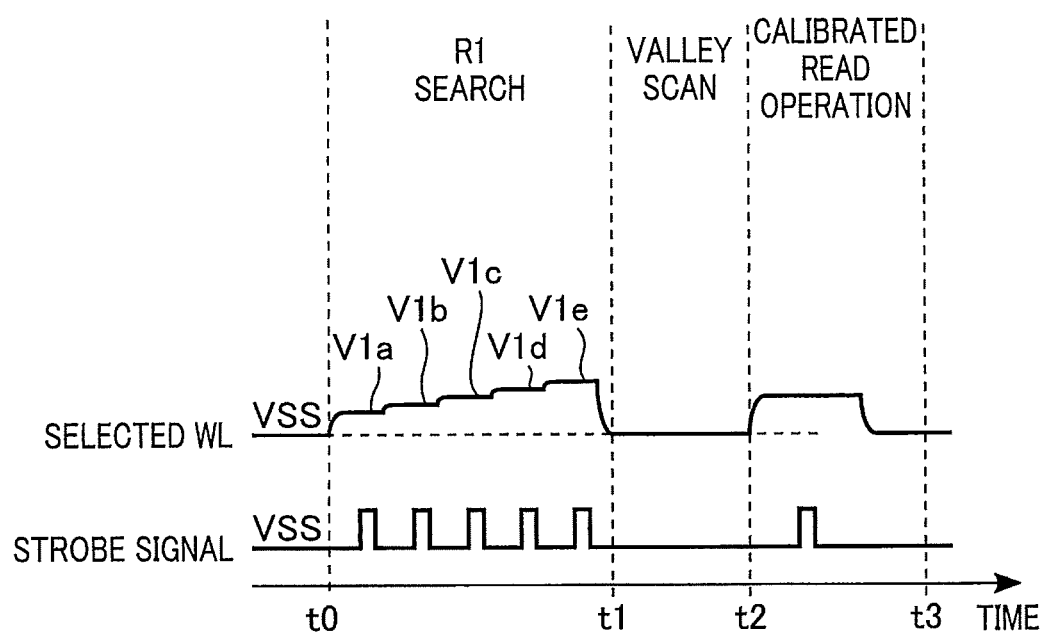
FIG. 14 is a timing chart showing voltages of a selected word line during on-chip tracking in a semiconductor memory device included in a memory system of a second embodiment.

The on-chip tracking generally includes three operations: a search read operation; a valley scan; and a calibrated read operation, as shown in FIG. 14.

The search read operation is a shift read operation for searching for a valley position of a threshold distribution, and unlike a normal read operation the search read operation is an operation of counting the on-state cells when applying a voltage to a selected word line WL. In a normal read operation, data is read for each page; however, in the search read operation it is determined whether the memory cell transistor MC is turned on or not in accordance with a read voltage. Therefore, a period of applying a read voltage in the search read operation (data read period) may be different from a normal read operation. In the example of FIG. 14, the number of on-state cells corresponding to voltages V1$a$, V1$b$, V1$c$, V1$d$, and V1$e$, respectively, is counted in the search read operation corresponding to the R1 read operation. The counting may be performed by the sequencer 15 or may be performed by the sense amplifier 20. Namely, the sequencer 15 may include a counter, or the sense amplifier 20 may include a counter.

The valley scan is an operation of searching for a valley position (the valley position between the threshold distribution at the "S0" level and the threshold distribution at the "S1" level in the example of FIG. 14) based on the result of counting the number of on-state cells by the search read operation. For example, the sequencer 15 obtains a histogram as described in the first embodiment using FIG. 8, that is, information on a valley position (hereinafter referred to as "valley information") from the result of counting the number of on-state cells, and determines a read voltage (V1' in the example of FIG. 14) based on the result. The valley information is, for example, stored in the status register 12, so that the controller 200 can read the valley information from the status register 12.

The calibrated read operation is a data read operation using the determined read voltage (e.g., V1'). The read data is transmitted to the controller 200.

When reading multilevel data in a batch, the search read operation may be performed for each level, or the result of the search read operation performed at one level (shift amount of a threshold voltage) may be reflected to other levels. More specifically, the search read operations corresponding to the R1, R4, R6, and R11 read operations may be performed, for example, in the read operation of the lower page, and read voltages V4', V6', and V11' corresponding to the R4, R6, and R11 read operations may be determined, for example, based on the result of the search read operation corresponding to the R1 read operation.

2.2. Patrol Operation

Next, the patrol operation will be described. The patrol operation of the present embodiment generally includes on-chip tracking corresponding to a plurality of levels and estimation processing of a read voltage. In the present embodiment, since a combination of a plurality of levels used for the on-chip tracking differs from the lower page, middle page, upper page, and top page, the calibrated read operation may be omitted. A case in which the calibrated read operation is omitted will be described below.

2.2.1. Overall Flow of Patrol Operation

Next, an overall flow of the patrol operation will be described with reference to FIG. 15. The example of FIG. 15 shows the patrol operation corresponding to one word line WL.

Figure 15:
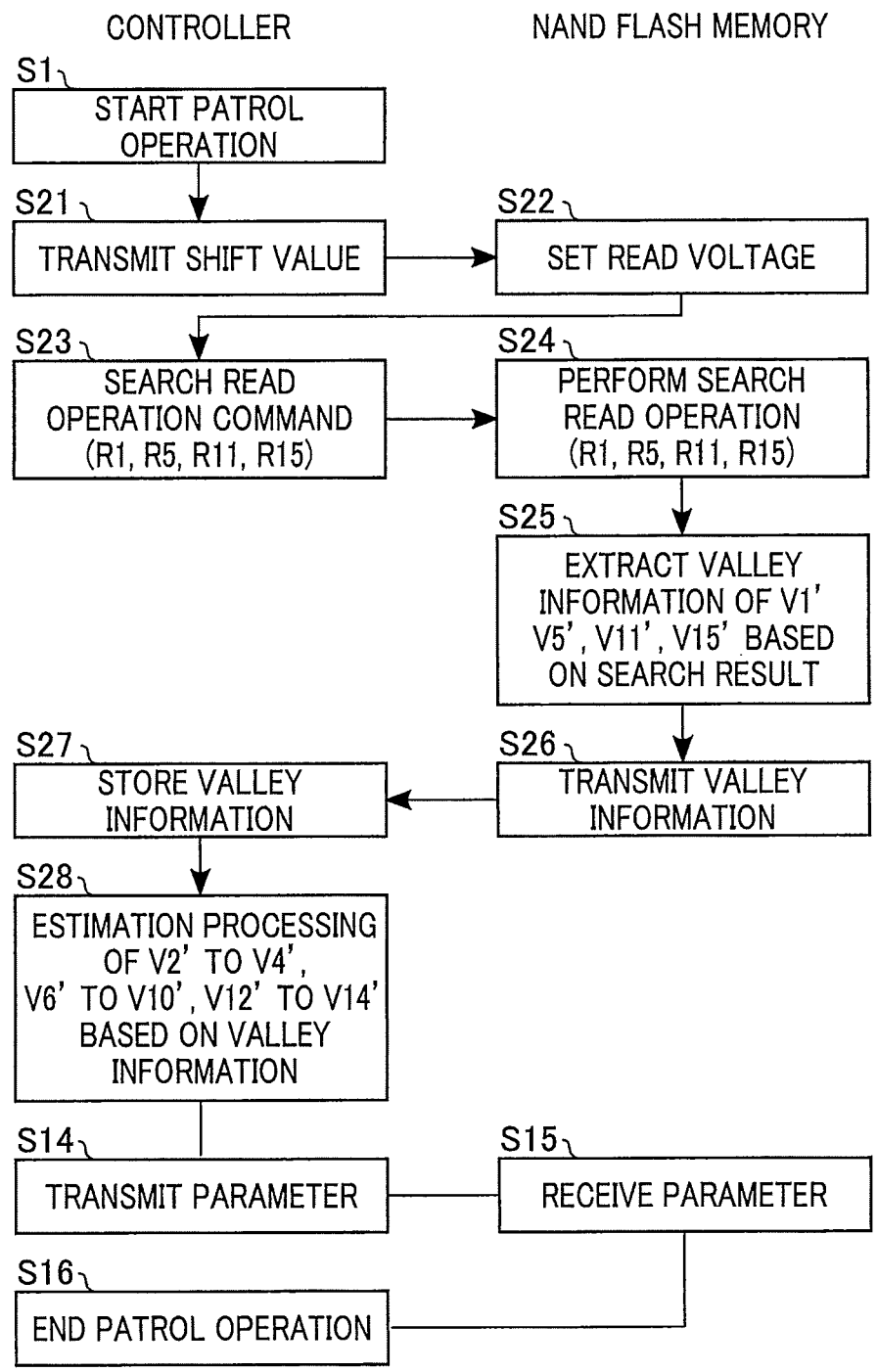
FIG. 15 is a flowchart of a patrol operation of the memory system of the second embodiment.

As shown in FIG. 15, the CPU 230 starts the patrol operation in step S1 in the same manner as shown in FIG. 11 in the first embodiment.

First, the CPU 230 transmits shift values of voltages V1, V5, V11, and V15 to the NAND flash memory 100 in order to perform the search read operation (on-chip tracking) (step S21). For example, the controller 200 may transmit each voltage value of voltages V1$a$, V1$b$, V1$c$, V1$d$, and V1$e$, and when the step-up widths of voltages V1$a$, V1$b$, V1$c$, V1$d$, and V1$e$ are the same, the controller 200 may transmit a step-up voltage value. The sequencer 15 sets a read voltage based on the received shift value (step S22).

Next, the CPU 230 transmits a search read operation command (on-chip tracking command) to the NAND flash memory 100 (step S23). The sequencer 15 performs search read operations corresponding to the R1, R5, R11, and R15 read operations based on the received command (step S24). The sequencer 15 extracts valley information on the R1, R5, R11, and R15 read operations from a result of a valley scan (step S25), and determines (computes) voltages V1', V5', V11', and V15'. The sequencer 15 transmits the extracted valley information to the controller 200 (step S26). The CPU 230 stores the received valley information, for example, in the buffer memory 240 (step S27).

Next, the CPU 230 performs the estimation processing of other voltages V2' to V4', V6' to V10', and V12' to V14' based on the obtained valley information (step S28).

The subsequent operations are the same as those of steps S14 to S16 of the first embodiment shown in FIG. 11.

The example of FIG. 15 shows the case in which the CPU 230 performs the estimation processing; however, the sequencer 15 may perform the estimation processing.

2.2.2. Command Sequence

Next, a command sequence transmitted from the controller 200 to the NAND flash memory 100 will be described with reference to FIG. 16. The example of FIG. 16 is a timing chart showing transmission and reception of the signal DQ (command, address, and data) and the ready/busy signal RBn in the patrol operation.

Figure 16:
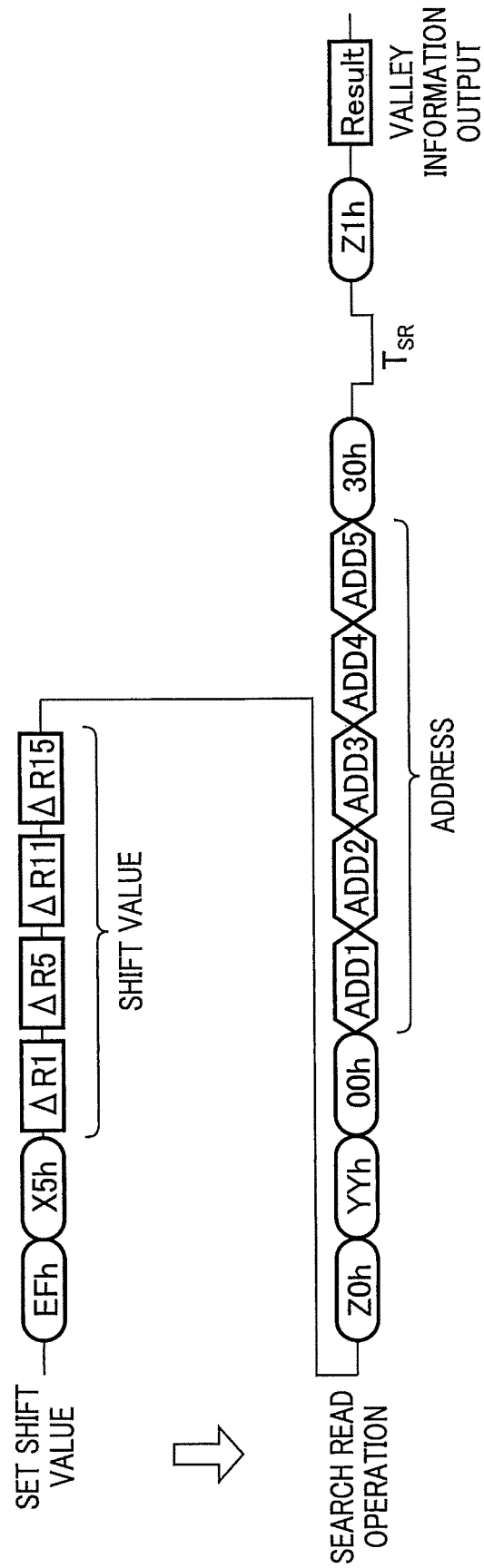
FIG. 16 is a command sequence of the patrol operation of the memory system of the second embodiment.

First, the CPU 230 transmits a command "EFh," command "X5h," and data "ΔR1," "ΔR5," "ΔR11," and "ΔR15" in the mentioned order to the NAND flash memory 100 in order to set shift values (read voltages) corresponding to the R1, R5, R11, and R15 read operations, as shown in FIG. 16.

Next, the CPU 230 transmits a command "Z0h," command "YYh," command "00h," addresses "ADD1" to "ADD5," and command "30h" in the mentioned order to the NAND flash memory 100 in order to perform the search read operation (on-chip tracking) based on the transmitted shift values. The command "Z0h" is a prefix command indicating execution of the search read operation.

Upon receiving the command "30h," the sequencer 15 performs the search read operation corresponding to each level. During the search read operation (reference symbol "$T_{SR}$" in FIG. 16), the sequencer 15 turns the ready/busy signal RBn to an "L" level.

Upon receiving the ready/busy signal RBn at an "H" level, the CPU 230 transmits a command "Z1h" indicating the output of valley information, and thereafter reads the valley information.

2.2.3. Voltage of Selected Word Line During Patrol Operation

Next, a voltage of a selected word line WL during the patrol operation will be described with reference to FIG. 17. The example of FIG. 17 shows a relationship between a read voltage of a selected word line WL and a strobe signal.

Figure 17:
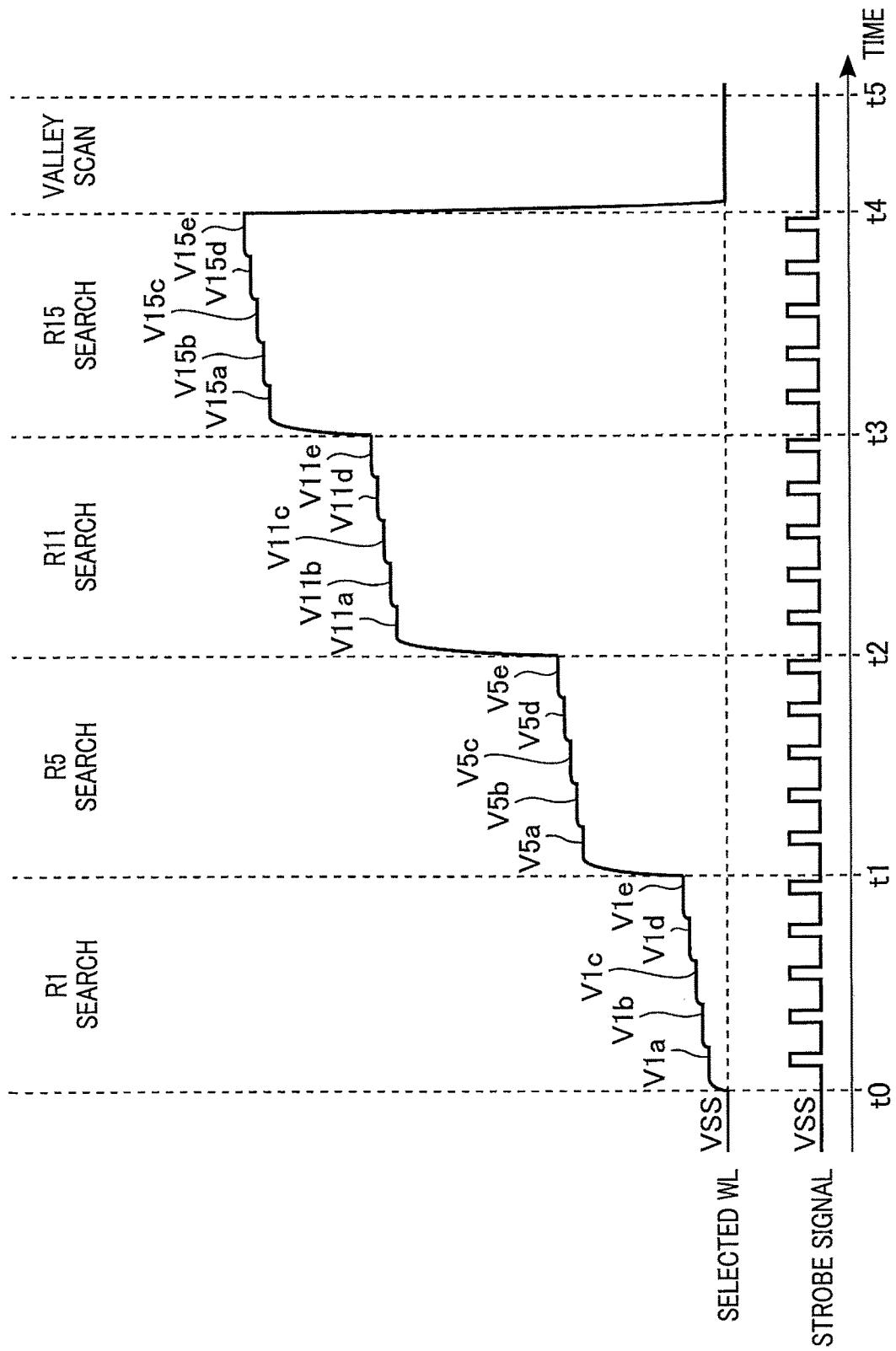
FIG. 17 is a timing chart showing voltages of a selected word line during the patrol operation in the semiconductor memory device included in the memory system of the second embodiment.

As shown in FIG. 17, the search read operation corresponding to the R1 read operation is performed in a period of time t0 to time t1. More specifically, when the search read operation corresponding to the R1 read operation is started, the row decoder 19 applies voltage V1a to the selected word line WL. In the period when voltage V1a is being applied to the selected word line WL, the strobe signal is set to an "H" level, and the sequencer 15, for example, counts the number of on-state cells corresponding to voltage V1a. When the counting of the number of on-state cells is ended, the strobe signal is set to an "L" level. Likewise, the row decoder 19 sequentially applies voltages V1b to V1e to the selected word line WL, and the sequencer 15, for example, counts the number of on-state cells corresponding to voltages V1b to V1e.

In a period of time t1 to time t2, the search read operation corresponding to the R5 read operation is performed. More specifically, when the search read operation corresponding to the R5 read operation is started, the row decoder 19 applies voltage V5a to the selected word line WL. The subsequent operations are the same as those of the search read operation corresponding to the R1 read operation, and the sequencer 15, for example, counts the number of on-state cells corresponding to voltages V5a to V5e.

In a period of time t2 to time t3, the search read operation corresponding to the R11 read operation is performed. More specifically, when the search read operation corresponding to the R11 read operation is started, the row decoder 19 applies voltage V11a to the selected word line WL. The subsequent operations are the same as those of the search read operation corresponding to the R1 read operation, and the sequencer 15, for example, counts the number of on-state cells corresponding to voltages V11a to V11e.

In a period of time t3 to time t4, the search read operation corresponding to the R15 read operation is performed. More specifically, when the search read operation corresponding to the R15 read operation is started, the row decoder 19 applies voltage V15a to the selected word line WL. The subsequent operations are the same as those of the search read operation corresponding to the R1 read operation, and the sequencer 15, for example, counts the number of on-state cells corresponding to voltages V15a to V15e.

In a period of time t4 to time t5, the sequencer 15 performs the valley scan. Thereby, the valley information is extracted, and voltages V1', V5', V11', and V15' are determined based on the valley information.

2.4. Advantageous Effects of Present Embodiment

According to the configuration of the present embodiment, advantageous effects similar to those of the first embodiment can be achieved.

Also, according to the configuration of the present embodiment, the NAND flash memory 100 can search for a valley position through the on-chip tracking. Namely, the NAND flash memory 100 can perform computing processing of the tracking operation. As a result, the controller 200, for example, need not perform the computing processing of the tracking operation, and thus can make the plurality of NAND flash memories 100 simultaneously perform the tracking operation. Accordingly, the processing time of the patrol operation on the plurality of NAND flash memories 100 can be reduced, and a decrease of the processing capability of the memory system due to the patrol operation can be suppressed.

According to the configuration of the present embodiment, the calibrated read operation can be omitted in the on-chip tracking. Thereby, the patrol operation time can be reduced.

According to the configuration of the present embodiment, the controller 200 can read the valley information. Since the valley information is small data of several bytes, the read time from the NAND flash memory 100 can be reduced.

3. Third Embodiment

Next, the third embodiment will be described. In the third embodiment, unlike the second embodiment, an example in which the on-chip tracking of the single read operation is applied will be described. Hereinafter, mainly the matters different from the first and second embodiments will be described.

3.1. Overall Flow of Patrol Operation

First, an overall flow of the patrol operation will be described with reference to FIG. 18. The example of FIG. 18 shows the patrol operation corresponding to one word line WL.

Figure 18:
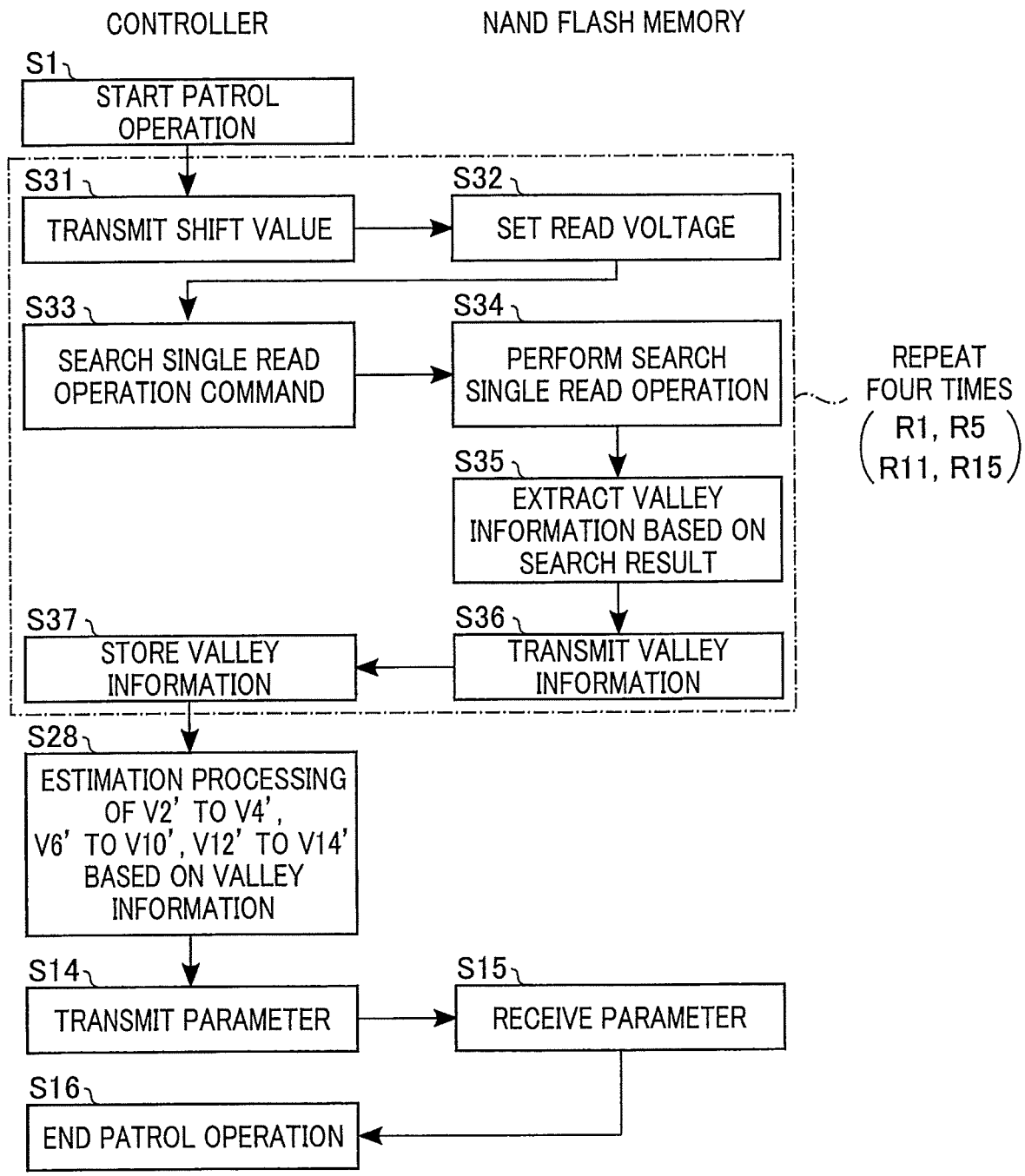
FIG. 18 is a flowchart of a patrol operation of a memory system of a third embodiment.

As shown in FIG. 18, the CPU 230 starts the patrol operation in step S1 in the same manner as that of the first embodiment shown in FIG. 11.

The CPU 230 performs four search read operations (on-chip tracking) corresponding to the R1, R5, R11, and R13 read operations, respectively. More specifically, the CPU 230 first transmits a shift value of voltage V1 to the NAND flash memory 100 in order to perform the search read operation corresponding to the R1 read operation (step S31). The sequencer 15 sets a read voltage based on the received shift value (step S32).

Next, the CPU 230 transmits a single read operation command of the search read operation to the NAND flash memory 100 (step S33). The sequencer 15 performs a search read operation corresponding to the R1 read operation based on the received command (step S24). The sequencer 15 extracts valley information from a result of a valley scan (step S35), and determines (computes) voltage V1'. The sequencer 15 transmits the extracted valley information to the controller 200 (step S36). The CPU 230 stores the received valley information, for example, in the buffer memory 240 (step S37).

Likewise, the CPU 230 repeats the operations of steps S31 to S37 in association with the search read operations corresponding to the R5, R11, and R15 read operations, and obtains valley information of each of them.

The subsequent operations are the same as those of step S28 of the second embodiment shown in FIG. 15, and steps S14 to S16 of the first embodiment shown in FIG. 11.

The example of FIG. 18 shows the case in which the CPU 230 performs the estimation processing; however, the sequencer 15 may perform the estimation processing.

3.2. Command Sequence

Next, a command sequence transmitted from the controller 200 to the NAND flash memory 100 will be described with reference to FIG. 19. The example of FIG. 19 is a timing chart showing transmission and reception of the signal DQ (command, address, and data) and the ready/busy signal RBn in the patrol operation.

Figure 19:
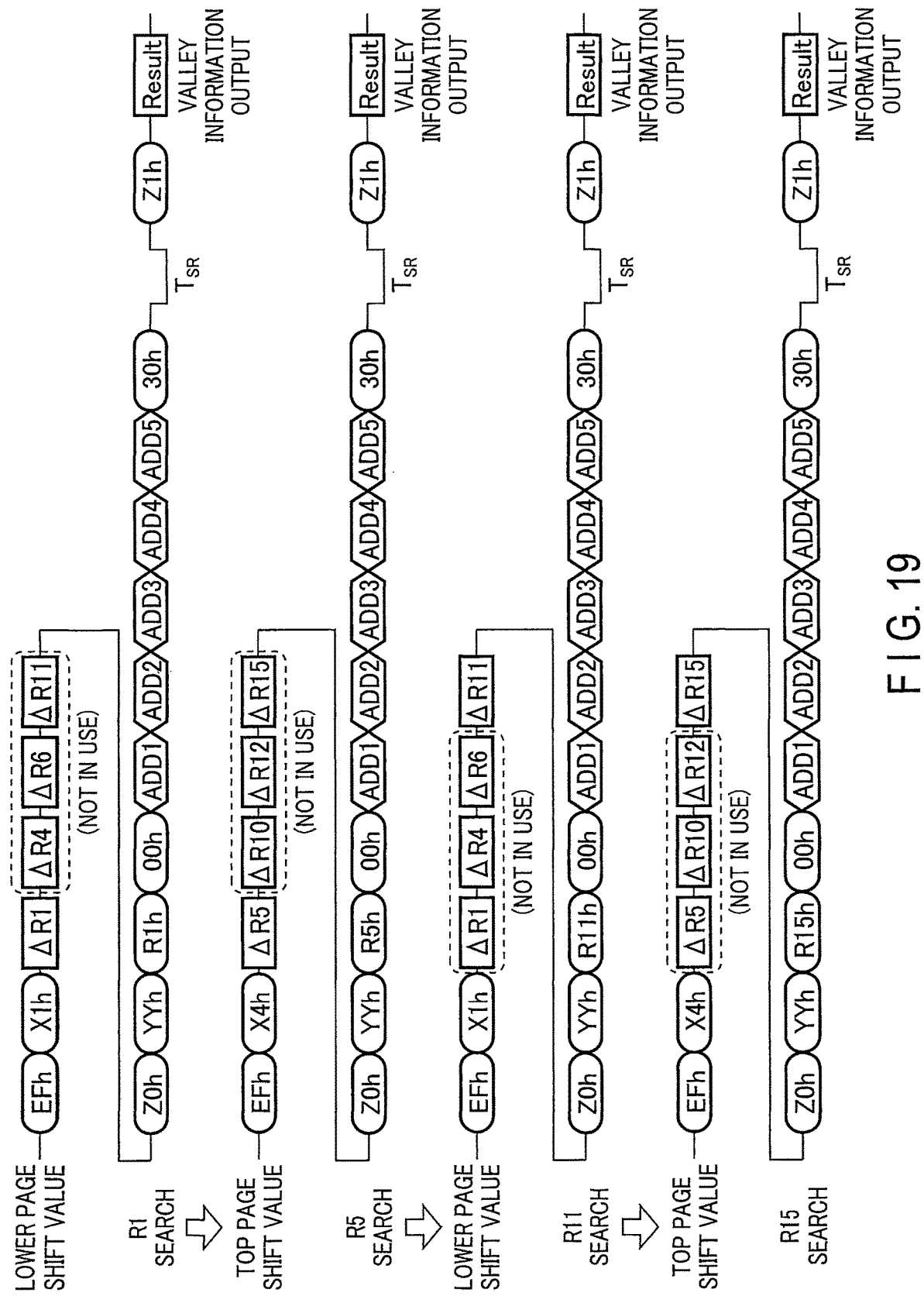
FIG. 19 is a command sequence of the patrol operation of the memory system of the third embodiment.

First, the CPU 230 transmits a command "EFh," command "X1h," and data "ΔR1," "ΔR4," "ΔR6," and "ΔR11" corresponding to the lower page in the mentioned order to the NAND flash memory 100 in order to set a shift value (read voltage) corresponding to the R1 read operation, as shown in FIG. 19. The command "X1h" indicates selection of the lower page, that is, the "S1," "S4," "S6," and "S11" levels. The data "ΔR4" and "ΔR6" indicate the shift values of voltages V4 and V6, respectively. In this case, the data "ΔR4," "ΔR6," and "ΔR11" are not used. Namely, the R4, R6, and R11 read operations are not performed. Therefore, 0 may be set, for example, in the data "ΔR4," "ΔR6," and "ΔR11."

Next, the CPU 230 transmits a command "Z0h," command "YYh," command "R1h," command "00h," addresses "ADD1" to "ADD5," and command "30h" in the mentioned order to the NAND flash memory 100 in order to perform the search read operation (on-chip tracking) corresponding to the R1 read operation. The command "R1h" provides notification that the R1 read operation is to be performed.

Upon receiving the command "30h," the sequencer 15 performs the search read operation corresponding to the R1 read operation. During the search read operation, the sequencer 15 turns the ready/busy signal RBn to an "L" level.

Upon receiving the ready/busy signal RBn at an "H" level, the CPU 230 transmits a command "Z1h," and thereafter reads the valley information corresponding to the R1 read operation.

Next, the CPU 230 transmits a command "EFh," command "X4h," and data "ΔR5," "ΔR10," "ΔR12," and "ΔR15" corresponding to the top page in the mentioned order to the NAND flash memory 100 in order to set a shift value corresponding to the R5 read operation. The command "X4h" indicates selection of the top page, that is, the "S5," "S10," "S12," and "S15" levels. The data "ΔR10" and "ΔR12" indicate the shift values of voltages V10 and V12, respectively. In this case, the data "ΔR10," "ΔR12," and "ΔR15" are not used. Namely, the R10, R12, and R15 read operations are not performed. Therefore, 0 may be set, for example, in the data "ΔR10," "ΔR12," and "ΔR15."

Next, the CPU 230 transmits a command "Z0h," command "YYh," command "R5h," command "00h," addresses "ADD1" to "ADD5," and command "30h" in the mentioned order to the NAND flash memory 100 in order to perform the search read operation corresponding to the R5 read operation. The command "R5h" provides notification that the R5 read operation is to be performed.

Upon receiving the command "30h," the sequencer 15 performs the search read operation corresponding to the R5 read operation. During the search read operation, the sequencer 15 turns the ready/busy signal RBn to an "L" level.

Upon receiving the ready/busy signal RBn at an "H" level, the CPU 230 transmits a command "Z1h," and thereafter reads the valley information corresponding to the R5 read operation.

Next, the CPU 230 transmits a command "EFh," command "X1h," and data "ΔR1," "ΔR4," "ΔR6," and "ΔR11" corresponding to the lower page in the mentioned order to the NAND flash memory 100 in order to set a shift value corresponding to the R11 read operation. The command "X1h" indicates selection of the lower page, that is, the "S1," "S4," "S6," and "S11" levels. In this case, the data "ΔR1," "ΔR4," and "ΔR6" are not used. Namely, the R1, R4, and R6 read operations are not performed. Therefore, 0 may be set, for example, in the data "ΔR1," "ΔR4," and "ΔR6."

Next, the CPU 230 transmits a command "Z0h," command "YYh," command "R11h," command "00h," addresses "ADD1" to "ADD5," and command "30h" in the mentioned order to the NAND flash memory 100 in order to perform the search read operation corresponding to the R11 read operation. The command "R11h" provides notification that the R11 read operation is to be performed.

Upon receiving the command "30h," the sequencer 15 performs the search read operation corresponding to the R11 read operation. During the search read operation, the sequencer 15 turns the ready/busy signal RBn to an "L" level.

Upon receiving the ready/busy signal RBn at an "H" level, the CPU 230 transmits a command "Z1h," and thereafter reads the valley information corresponding to the R11 read operation.

Next, the CPU 230 transmits a command "EFh," command "X4h," and data "ΔR5," "ΔR10," "ΔR12," and "ΔR15" corresponding to the top page in the mentioned order to the NAND flash memory 100 in order to set a shift value corresponding to the R15 read operation. In this case, the data "ΔR5," "ΔR10," and "ΔR12" are not used. Namely, the R5, R10, and R12 read operations are not performed. Therefore, 0 may be set, for example, in the data "ΔR5," "ΔR10," and "ΔR12."

Next, the CPU 230 transmits a command "Z0h," command "YYh," command "R15h," command "00h," addresses "ADD1" to "ADD5," and command "30h" in the mentioned order to the NAND flash memory 100 in order to perform the search read operation corresponding to the R15 read operation. The command "R15h" provides notification that the R15 read operation is to be performed.

Upon receiving the command "30h," the sequencer 15 performs the search read operation corresponding to the R15 read operation. During the search read operation, the sequencer 15 turns the ready/busy signal RBn to an "L" level.

Upon receiving the ready/busy signal RBn at an "H" level, the CPU 230 transmits a command "Z1h," and thereafter reads the valley information corresponding to the R15 read operation.

The order of the search read operations corresponding to the R1, R5, R11, and R15 read operations, respectively, may be discretionarily set.

3.3. Voltage of Selected Word Line During Patrol Operation

Next, a voltage of a selected word line WL during the patrol operation will be described with reference to FIG. 20. The example of FIG. 20 shows a relationship between a read voltage of a selected word line WL and a strobe signal.

Figure 20:
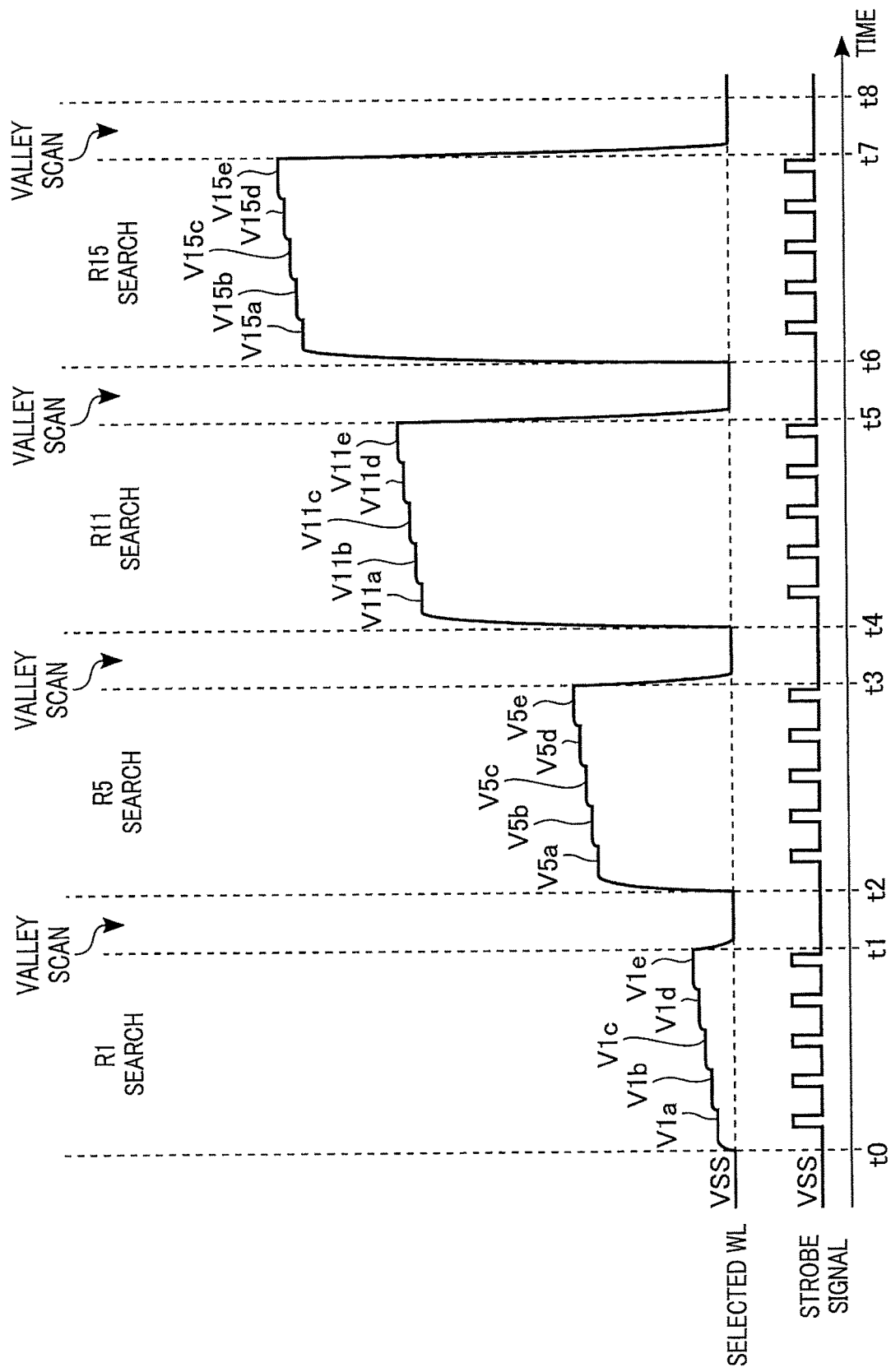
FIG. 20 is a timing chart showing voltages of a selected word line during the patrol operation in a semiconductor memory device included in the memory system of the third embodiment.

As shown in FIG. 20, the search read operation corresponding to the R1 read operation is performed in a period of time t0 to time t1, in the same manner as the period of time t0 to time t1 of the second embodiment shown in FIG. 17. Thereby, the sequencer 15, for example, counts the number of on-state cells corresponding to voltages V1a to V1e.

In a period of time t1 to time t2, the sequencer 15 performs a valley scan corresponding to the R1 read operation. Thereby, valley information corresponding to the R1 read operation is extracted, and voltage V1' is determined based on the extracted valley information.

In a period of time t2 to time t3, the search read operation corresponding to the R5 read operation is performed, in the same manner as the period of time t1 to time t2 of the second embodiment shown in FIG. 17. Thereby, the sequencer 15, for example, counts the number of on-state cells corresponding to voltages V5a to V5e.

In a period of time t3 to time t4, the sequencer 15 performs a valley scan corresponding to the R5 read operation. Thereby, valley information corresponding to the R5 read operation is extracted, and voltage V5' is determined based on the extracted valley information.

In a period of time t4 to time t5, the search read operation corresponding to the R11 read operation is performed, in the same manner as the period of time t2 to time t3 of the second embodiment shown in FIG. 17. Thereby, the sequencer 15, for example, counts the number of on-state cells corresponding to voltages V11a to V11e.

In a period of time t5 to time t6, the sequencer 15 performs a valley scan corresponding to the R11 read operation. Thereby, valley information corresponding to the R11 read operation is extracted, and voltage V11' is determined based on the extracted valley information.

In a period of time t6 to time t7, the search read operation corresponding to the R15 read operation is performed, in the same manner as the period of time t3 to time t4 of the second embodiment shown in FIG. 17. Thereby, the sequencer 15, for example, counts the number of on-state cells corresponding to voltages V15a to V15e.

In a period of time t7 to time t8, the sequencer 15 performs a valley scan corresponding to the R15 read operation. Thereby, valley information corresponding to the R15 read operation is extracted, and voltage V15' is determined based on the extracted valley information.

3.4. Advantageous Effects of Present Embodiment

According to the configuration of the present embodiment, advantageous effects similar to those of the first and second embodiments can be achieved.

4. Modification, etc.

The memory system according to the above-described embodiments includes a semiconductor memory device (100) and a controller (200) configured to control the semiconductor memory device. The semiconductor memory device includes: a plurality of memory cells (MC) capable of storing at least first to third data; and a word line (WL) coupled to the plurality of memory cells. The first data (lower bit, lower page) is determined by a first read operation including a first read level ("S1" level). The second data (top bit, top page) is determined by a second read operation including a second read level ("S15" level). The third data (e.g., middle bit, middle page) is determined by a third read operation including a third read level (e.g., "S3" level). The controller is configured to control the semiconductor memory device to perform a forth read operation including the first and second read levels in a search operation (patrol operation) for first to third read voltages (V1', V15', V3') corresponding to the first to third read levels, respectively.

Applying the above-described embodiments can provide a memory system with an improved processing capability.

The embodiments are not limited to the configurations described above, but can be modified in various ways.

For example, in the first embodiment, the NAND flash memory 100 may perform the computing processing for determining voltages V1' to V15'.

In the second and third embodiments, the controller 200 may perform the computing processing for determining voltages V1', V5', V11', and V15', and the NAND flash memory 100 may perform the computing processing (estimation processing) for determining voltages V2' to V4', V6' to V10', and V12' to V14'.

Also, the patrol operation of the above-described embodiments may be performed in the retry read operation. Namely, the search operation for a read voltage according to the above-described embodiments may be performed when the number of fail bits exceeds the number of correctable error bits of the ECC circuit 260 in a normal read operation.

In the above-described embodiments, the semiconductor memory device is not limited to a three-dimensional stacked NAND flash memory. The semiconductor memory device may be a plane type NAND flash memory. The above-described embodiments can be applied to a nonvolatile memory with a memory cell transistor capable of holding data of three bits or higher.

Furthermore, the term "couple" in the above-described embodiments includes a state of indirect coupling via a transistor, a resistor, or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of controlling a semiconductor memory device including a plurality of memory cells and a word line coupled to the plurality of memory cells, wherein each of the plurality of memory cells is configured to store n-bit data, and n is an integer of three or more, the method comprising:
controlling the plurality of memory cells to store the n-bit data by correlating the n-bit data with first to $2^n$-th threshold voltage regions, wherein a voltage of a (k+1)-th threshold voltage region is higher than that of a k-th threshold voltage region, k is an integer greater than or equal to one, and k is an integer smaller than $2^n$;
performing a first read operation corresponding to first to fourth read levels, in order to optimize first to fourth read voltages corresponding to the first to fourth read levels;
determining the first to fourth read voltages based on a result of the first read operation; and
determining fifth to ($2^n$−1)-th read voltages based on the determined first to fourth read voltages, the fifth to ($2^n$−1)-th read voltages corresponding to fifth to ($2^n$−1)-th read levels, wherein
the first read level is between the first threshold voltage region and the second threshold voltage region,
the second read level is between the ($2^n$−1)-th threshold voltage region and the $2^n$-th threshold voltage region, the third read level is between a p-th threshold voltage region and a (p+1)-th threshold voltage region, wherein p is an integer greater than one and smaller than ($2^n-1$), and the fourth read level is between a q-th threshold voltage region and a (q+1)-th threshold voltage region, wherein q is an integer greater than one and smaller than ($2^n-1$), and q is different from p.

2. The method according to claim 1, wherein
the first read level is used to read first bit data of the n-bit data,
the second read level is used to read second bit data of the n-bit data,
the third read level is used to read the first bit data, and
the fourth read level is used to read the second bit data.

3. The method according to claim 2, further comprising:
determining the fifth read voltage based on the determined first read voltage, the fifth read voltage corresponding to the fifth read level, wherein the fifth read level is between the second threshold voltage region and the third threshold voltage region; and
determining the sixth read voltage based on the determined second read voltage, the sixth read voltage corresponding to the sixth read level, wherein the sixth read level is between the ($2^n-2$)-th threshold voltage region and the ($2^n-1$)-th threshold voltage region.

4. The method according to claim 3, wherein the fifth read level and the sixth read level are used to read third bit data of the n-bit data.

5. The method according to claim 3, wherein
n is four,
p is eleven, and
q is five.

6. The method according to claim 5, further comprising
determining the seventh to thirteenth read voltages based on at least one of the determined third read voltage and the determined fourth read voltage, wherein
each of the seventh to thirteenth read voltages is between the ($2^n-k-1$)-th threshold voltage region and the ($2^n-k$)-th threshold voltage region, k is an integer of three or more, k is an integer of eleven or less, k is not ten, and k is not four.

7. The method according to claim 5, further comprising:
performing a seventh read operation using a ($2^n+1$)-th read level, an eighth read operation using a ($2^n+2$)-th read level, and a ninth read operation using a ($2^n+3$)-th read level, wherein the ($2^n+1$)-th read level is between the first read level and the fourth read level, the ($2^n+2$)-th read level is between the fourth read level and the third read level, and the ($2^n+3$)-th read level is between the third read level and the second read level; and
determining the first to fourth read voltages based on a result of the first read operation, a result of the seventh read operation, a result of the eighth read operation, and a result of the ninth read operation.

8. The method according to claim 2, further comprising:
performing a sixth read operation using a $2^n$-th read level, wherein the $2^n$-th read level is between the first read level and the third read level; and
determining the first bit data based on a result of the first read operation and a result of the sixth read operation.

9. The method according to claim 1, further comprising repeating the first read operation two or more times while shifting a first voltage, a second voltage, a third voltage, and a fourth voltage applied to the word line, wherein
the first voltage corresponds to the first read level,
the second voltage corresponds to the second read level,
the third voltage corresponds to the first read level, and
the fourth voltage corresponds to the second read level.

10. The method according to claim 9, further comprising performing a patrol operation on the semiconductor memory device, wherein
the first read operation is performed in the patrol operation.

11. The method according to claim 10, further comprising transmitting, two or more times, a shift value of the first to fourth voltages and a read command of the first read operation to the semiconductor memory device in association with the first read operation repeated two or more times.

12. The method according to claim 1, wherein the first read operation includes:
a second read operation of applying at least fifth and sixth voltages to the word line in that order in association with the first read level, and performing a read operation at least twice;
a third read operation of applying at least seventh and ninth voltages to the word line in that order in association with the second read level, and performing a read operation at least twice;
a fourth read operation of applying at least tenth and eleventh voltages to the word line in that order in association with the third read level, and performing a read operation at least twice; and
a fifth read operation of applying at least twelfth and thirteenth voltages to the word line in that order in association with the fourth read level, and performing a read operation at least twice.

13. The method according to claim 12, further comprising determining the first read voltage based on a result of the second read operation, determining the second read voltage based on a result of the third read operation, determining the third read voltage based on a result of the fourth read operation, and determining the fourth read voltage based on a result of the fifth read operation.

14. The method according to claim 13, further comprising:
determining the first to fourth read voltages after performing the second to fifth read operations; and
determining the fifth to ($2^n1$)-th read voltages based on the determined first to fourth read voltages.

15. The method according to claim 13, further comprising:
determining the first read voltage after performing the second read operation, determining the second read voltage after performing the third read operation, determining the third read voltage after performing the fourth read operation, determining the fourth read voltage after performing the fifth read operation, and
determining the fifth to ($2^n-1$)-th read voltages based on the determined first to fourth read voltages.

* * * * *